United States Patent
Beale et al.

(10) Patent No.: US 11,677,502 B2
(45) Date of Patent: *Jun. 13, 2023

(54) TRANSMITTER, RECEIVER AND METHODS

(71) Applicant: Sony Group Corporation, Tokyo (JP)

(72) Inventors: Martin Warwick Beale, Basingstoke (GB); Samuel Asangbeng Atungsiri, Basingstoke (GB); Shin Horng Wong, Basingstoke (GB)

(73) Assignee: SONY GROUP CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/460,367

(22) Filed: Aug. 30, 2021

(65) Prior Publication Data
US 2021/0409153 A1 Dec. 30, 2021

Related U.S. Application Data

(63) Continuation of application No. 16/820,720, filed on Mar. 17, 2020, now Pat. No. 11,108,501, which is a
(Continued)

(30) Foreign Application Priority Data

Dec. 23, 2016 (EP) .................... 16206874

(51) Int. Cl.
*H04L 1/00* (2006.01)
*H03M 13/27* (2006.01)
(Continued)

(52) U.S. Cl.
CPC .......... *H04L 1/0071* (2013.01); *H03M 13/27* (2013.01); *H04L 1/0041* (2013.01);
(Continued)

(58) Field of Classification Search
CPC ... H04L 1/0071; H04L 1/0041; H04L 1/0057; H04L 1/04; H04L 27/2621; H04L 27/2672; H04L 27/266; H03M 13/27
See application file for complete search history.

(56) References Cited

U.S. PATENT DOCUMENTS

2010/0077276 A1* 3/2010 Okamura .............. H04L 1/0072
714/752
2010/0232338 A1* 9/2010 Krishnamoorthi .... H04L 1/0065
370/312
(Continued)

FOREIGN PATENT DOCUMENTS

CN 103873187 A 6/2014
EP 1357718 A2 10/2003
(Continued)

OTHER PUBLICATIONS

DVB, "Digital Videa Broadcasting (DVB); Next Generation Broadcasting system to Handheld, physical layer specification (DVB-NGH)", DVB Document A160, Nov. 2012, pp. 65-68.
(Continued)

*Primary Examiner* — Kabir A Timory
(74) *Attorney, Agent, or Firm* — Xsensus LLP

(57) ABSTRACT

A transmitter for transmitting data to communications devices via a wireless access. The transmitter including modulator circuitry configured to receive modulation symbols of a segment and to rotate each modulation symbol by an angle dependent on a choice of modulation scheme, and receive each of the segments of rotated modulation symbols and for each segment to separate real and imaginary components of the rotated modulation symbols for the segment and to interleave the real components of the rotated modulation symbols of the segment differently to the imaginary components of the rotated modulation symbols of the segment. The circuitry also is configured to recombine the real
(Continued)

and imaginary interleaved components of the rotated modulation symbols of each segment and to form from the real and imaginary components modulation cells.

20 Claims, 10 Drawing Sheets

Related U.S. Application Data continuation of application No. 16/469,183, filed as application No. PCT/EP2017/081523 on Dec. 5, 2017, now Pat. No. 10,601,547.

(51) Int. Cl.
 *H04L 1/04* (2006.01)
 *H04L 27/26* (2006.01)
(52) U.S. Cl.
 CPC .............. *H04L 1/0057* (2013.01); *H04L 1/04* (2013.01); *H04L 27/2621* (2013.01); *H04L 27/2672* (2013.01)

(56) References Cited

U.S. PATENT DOCUMENTS

| | | |
|---|---|---|
| 2015/0003809 A1 | 1/2015 | Matsuda et al. |
| 2015/0373627 A1 | 12/2015 | Ryu et al. |

FOREIGN PATENT DOCUMENTS

| | | |
|---|---|---|
| EP | 1357718 A3 | 10/2006 |
| WO | 2015/106129 A1 | 7/2015 |
| WO | 2016/075475 A1 | 5/2016 |

OTHER PUBLICATIONS

Huawei, "Modulation diversify for OFDM", 3GPP TSG RAN WG1 Meeting No. 31, R1-830156, Tokyo Japan, Feb. 18-21, 2003, 6 pages.
Etsi, "Digital Video Breadcasting (DVB); Frame structure channel coding and modulation for a second generation digital terrestrial television broadcasting system (DVB-T2)", ETSI EN 302 755 V1.3.1, Apr. 2012, pp. 1-188.
Longoni et al., "Radio Access Network Architecture", WCDMA for UMTS—HSPA Evolution and LTE, pp. 67-90.
Boutros et al., "Signal Space Diversity: a power and bandwidth efficient diversity technique for the Rayleigh fading channel", IEEE Transactions on Information Theory, Jul. 1998, pp. 1-34.
3GPP, "3rd Generation Partnersiip Project; Technical Specification Group Radio Access Network; Evolved Universal Terrestrial Radio Access (E-UTRA), Multiplexing and channel coding", Release 13, 3GPP TS 36.212 V13.2.0, Jun. 2016, pp. 1-140.
International Search Report and Written Opinion dated Apr. 4, 2018 for PCT/EP2017/081523 filed on Dec. 5, 2017, 10 pages.

* cited by examiner

RE mapping order due to I-Interleaver

RE mapping order due to Q-Interleaver

FIG. 10 Transport channel processing chain

TRANSMITTER, RECEIVER AND METHODS

CROSS-REFERENCE TO RELATED APPLICATIONS

The present application is a continuation of U.S. application Ser. No. 16/820,720, filed Mar. 17, 2020, which is a continuation of U.S. application Ser. No. 16/469,183, filed Jun. 13, 2019 (now U.S. Pat. No. 10,601,547), which is based on PCT filing PCT/EP2017/081523, filed Dec. 5, 2017, which claims priority to EP 16206874.6, filed Dec. 23, 2016, the entire contents of each are incorporated herein by reference.

TECHNICAL FIELD OF THE DISCLOSURE

The present disclosure relates to transmitters, receivers and methods of transmitting and receiving payload data using Orthogonal Frequency Division Multiplexed (OFDM) symbols.

The present disclosure also relates to communications devices configured to transmit data to a wireless communications network and to receive data from the wireless communications network via a wireless access interface using a transmitter and a receiver respectively. The present invention also relates to methods of communicating using communications devices, wireless communications networks, infrastructure equipment and methods.

BACKGROUND OF THE DISCLOSURE

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Third and fourth generation mobile telecommunication systems, such as those based on the 3GPP defined UMTS and Long Term Evolution (LTE) architecture are able to support more sophisticated services than simple voice and messaging services offered by previous generations of mobile telecommunication systems. For example, with the improved radio interface and enhanced data rates provided by LTE systems, a user is able to enjoy high data rate applications such as mobile video streaming and mobile video conferencing that would previously only have been available via a fixed line data connection. The demand to deploy third and fourth generation networks is therefore strong and the coverage area of these networks, i.e. geographic locations where access to the networks is possible, is expected to increase rapidly.

There is also a demand to make further improvements in the efficiency with which data is communicated in future wireless communications networks. A wireless access interface provided by such future wireless communications networks may also use Orthogonal Frequency Division Multiplexing (OFDM).

OFDM is a well-established technique which can be generally described as providing K narrow band sub-carriers (where K is an integer) which are modulated in parallel, each sub-carrier communicating a modulated data symbol such as for example Quadrature Amplitude Modulated (QAM) symbol or Quaternary Phase-shift Keying (QPSK) symbol. The modulation of the sub-carriers is formed in the frequency domain and transformed into the time domain for transmission. Since the data symbols are communicated in parallel on the sub-carriers, the same modulated symbols may be communicated on each sub-carrier for an extended period. The sub-carriers are modulated in parallel contemporaneously, so that in combination the modulated carriers form an OFDM symbol. The OFDM symbol therefore comprises a plurality of sub-carriers each of which has been modulated contemporaneously with different modulation symbols, which form modulation cells on the sub-carriers of the OFDM symbols.

Our co-pending International patent application PCT/GB2015/053440 discloses a transmitter and a receiver suitable for application in transmitting and receiving signals via a wireless access interface according to an LTE standard. According to the disclosure an I/Q interleaver is arranged maximally to separate the I and Q components of the modulation symbols in the resource element domain.

SUMMARY OF THE DISCLOSURE

Embodiments of the present technique can provide a transmitter which may form part of an infrastructure equipment of a wireless communications network for transmitting data to communications devices via a wireless access interface having a time divided structure of repeating time units, each of the time units comprising a predetermined number of resource elements disposed in time and frequency. The transmitter includes modulator circuitry comprising modulation symbol generator circuitry configured to receive the data and to generate modulation symbols representing the data, each modulation symbol for modulating a corresponding sub-carrier of one or more OFDM symbols in accordance with a modulation scheme, segmentation circuitry configured to receive the modulation symbols representing the data and to divide the modulation symbols into segments of modulation symbols for transmission, each segment of the modulation symbols for transmission via an integer number of the one or more OFDM symbols or part thereof. Modulation rotation circuitry is configured to receive the modulation symbols of one segment and to rotate each modulation symbol by an angle dependent on the choice of modulation scheme, I/Q interleaver circuitry, is configured to receive each of the segments of rotated modulation symbols and for each segment to separate real and imaginary components of the rotated modulation symbols for the segment and to interleave the real components of the rotated modulation symbols of the segment differently to the imaginary components of the rotated modulation symbols of the segment, and I/Q combiner circuitry is configured to re-combine the real and imaginary interleaved components of the rotated modulation symbols of each segment and to form from the real and imaginary components modulation cells. Each modulation cell modulates one of the plurality of sub-carriers of each of the integer number of one or more OFDM symbols or part thereof for the segment to be transmitted.

Embodiments of the present technique can provide an improved arrangement for transmitting data using OFDM symbols in which real and imaginary components of the modulation symbols are rotated and interleaved differently. By dividing the modulation symbols into segments of modulation symbols for transmission on an integer number of OFDM symbols or part thereof, which may be less than a number of OFDM symbols in each time-unit allocated to the communications device for receiving the data, then a delay in transmitting and receiving the data can be reduced and a size of an interleaver memory for interleaving and de-interleaving can be reduced.

In some embodiments, before the modulation symbols are transmitted, a phase rotation is applied to the modulation symbols in accordance with a rotation angle so that constellation points of the modulation scheme are rotated by the rotation angle in the complex plane. The real and imaginary components of the modulation symbols are then separated and interleaved separately to improve the integrity of the communicated data.

Those acquainted with OFDM will appreciate that embodiments of the present technique can apply equally for down-link communications from a base station to a communications device as well as communications from the communications device to the base station. For the example of an LTE wireless access interface it will be appreciated that Single Carrier Frequency Division Multiplexing (SC-FDMA) can be encoded using a Discrete Fourier Transform Spread OFDM (DFT-S-OFDM) structure and is hence part of the family of OFDM signals. Accordingly transmitter and receiver embodiments can be provided for both uplink as well as downlink communications.

Various further aspects and embodiments of the disclosure are provided in the appended claims, including but not limited to, a transmitter, a receiver, a communications device, infrastructure equipment, mobile communications system and a method of communicating.

BRIEF DESCRIPTION OF DRAWINGS

Embodiments of the present disclosure will now be described by way of example only with reference to the accompanying drawings in which like parts are provided with corresponding reference numerals and in which.

DESCRIPTION OF EXAMPLE EMBODIMENTS

Figure 1:
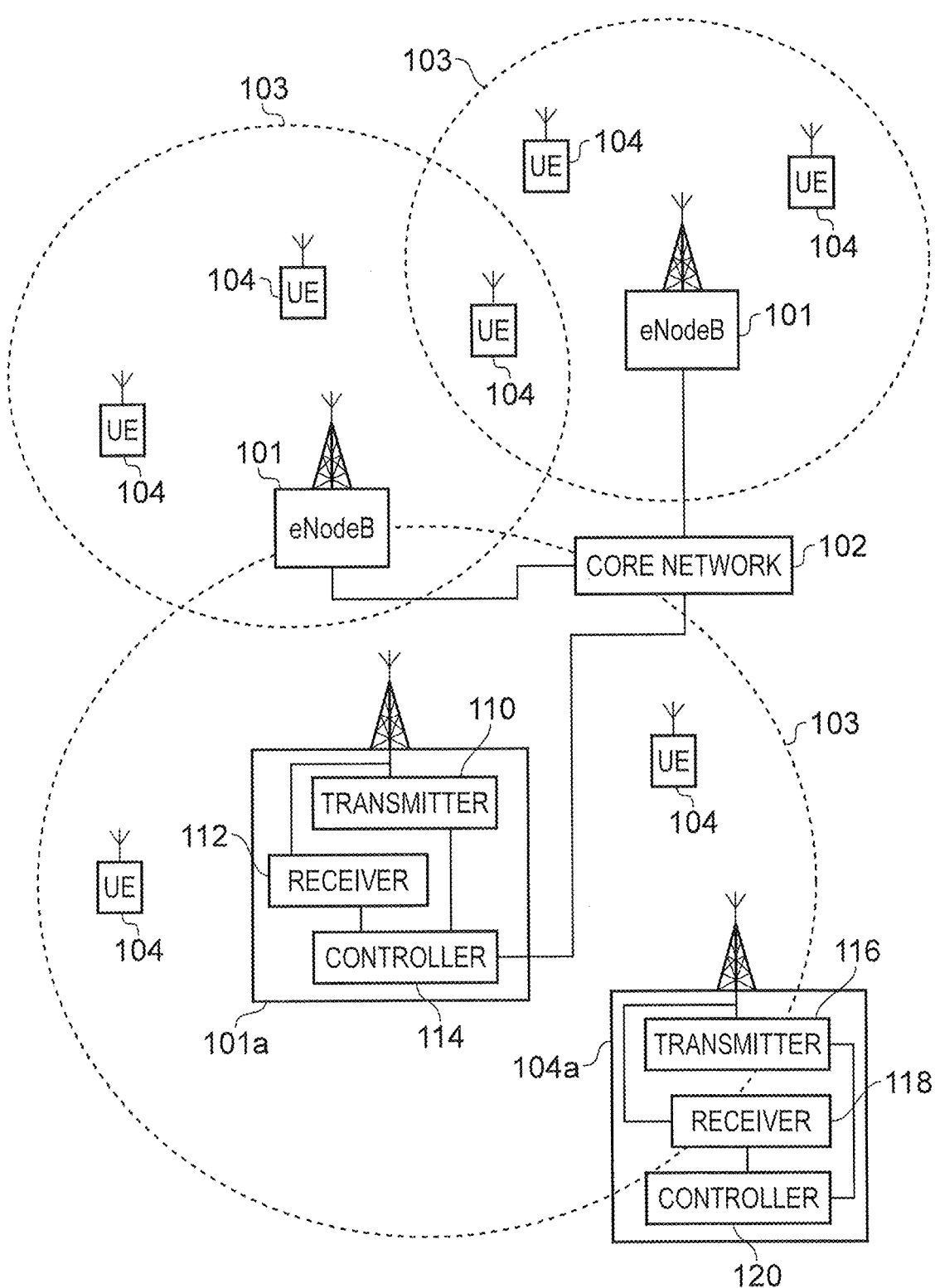
FIG. 1 provides a schematic diagram illustrating an example of a conventional mobile communications system.

Embodiments of the present technique find application with wireless communications systems which provide a wireless access interface which utilises OFDM to transmit and receive data. For example, embodiments of the present technique find application with a new radio access technology or new radio (NR), which is also known as 5G. In other embodiments a transmitter or a receiver may form part of a communications device or an infrastructure equipment configured in accordance with an LTE standard. As an example, FIG. 1 provides a schematic diagram illustrating some basic functionality of a mobile telecommunications network/system operating in accordance with LTE principles. Various elements of FIG. 1 and their respective modes of operation are defined in the relevant standards administered by the 3GPP® body, and also described in many books on the subject, for example, Holma H. and Toskala A [1] ISBN 9780470-319338 Fourth edition, 2007 Chapter 5. It will be appreciated that operational aspects of the telecommunications network which are not specifically described below may be implemented in accordance with any known techniques, for example according to the relevant standards.

The mobile telecommunications system, where the system shown in FIG. 1 includes infrastructure equipment comprising base stations 101 which are connected to a core network 102, which operates in accordance with a conventional arrangement which will be understood by those acquainted with communications technology. The infrastructure equipment 101 may also be referred to as a base station, network element, enhanced NodeB (eNodeB (eNB)) or a coordinating entity for example, and provides a wireless access interface to the one or more communications devices within a coverage area or cell represented by a broken line 103. One or more mobile communications devices 104 may communicate data via the transmission and reception of signals representing data using the wireless access interface. The core network 102 may also provide functionality including authentication, mobility management, charging and so on for the communications devices served by the network entity.

The mobile communications devices of FIG. 1 may also be referred to as communications terminals, user equipment (UE), terminal devices and so forth, and are configured to communicate with one or more other communications devices served by the same or a different coverage area via the network entity. These communications may be performed by transmitting and receiving signals representing data using the wireless access interface over the two way communications links.

As shown in FIG. 1, one of the eNodeBs 101a is shown in more detail to include a transmitter 110 for transmitting signals via a wireless access interface to the one or more communications devices or UEs 104, and a receiver 112 to receive signals from the one or more UEs within the coverage area 103. A controller 114 controls the transmitter 110 and the receiver 112 to transmit and receive the signals via the wireless access interface. The controller 114 may perform a function of controlling the allocation of communications resource elements of the wireless access interface and may in some examples include a scheduler for scheduling transmissions via the wireless access interface for both an uplink and a downlink.

An example UE 104a is shown in more detail to include a transmitter 116 for transmitting signals on the uplink of the wireless access interface to the eNodeB 101 and a receiver 118 for receiving signals transmitted by the eNodeB 101 on the downlink via the wireless access interface. The transmitter 116 and the receiver 118 are controlled by a controller 120.

LTE Wireless Access Interface

Mobile telecommunications systems such as those arranged in accordance with the 3GPP defined Long Term Evolution (LTE) architecture use an orthogonal frequency division modulation (OFDM) based wireless access interface for the radio downlink (so-called OFDMA) and a single carrier frequency division multiple access scheme (SC-FDMA) on the radio uplink. The down-link and the up-link of a wireless access interface according to an LTE standard is presented in FIGS. 2 and 3.

Figure 2:
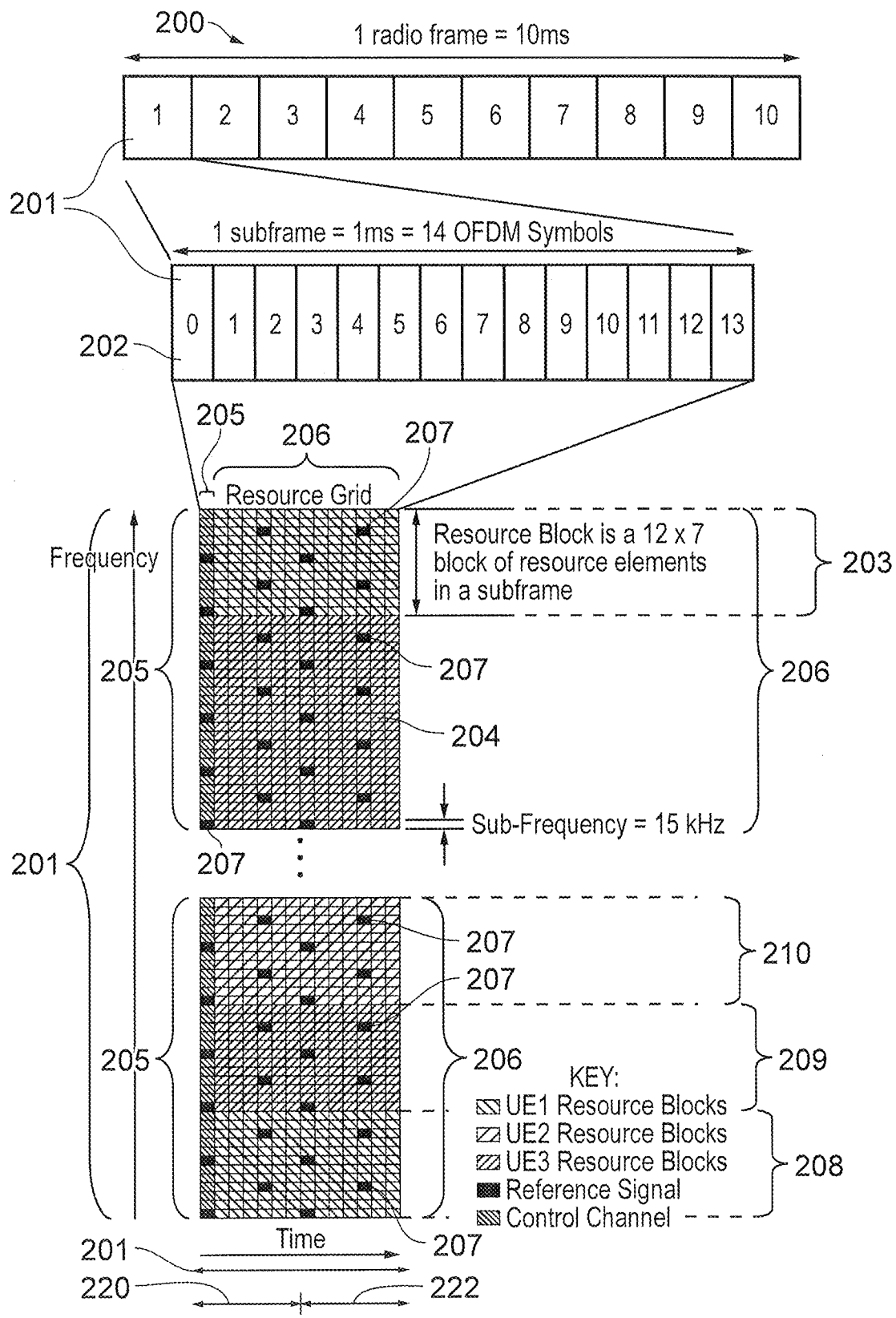
FIG. 2 provides a schematic diagram of a structure of a downlink of a wireless access interface of a mobile communications system operating according to an LTE standard.

FIG. 2 provides a simplified schematic diagram of the structure of a downlink of a wireless access interface that may be provided by or in association with the eNodeB of FIG. 1 when the communications system is operating in accordance with the LTE standard. In LTE systems the wireless access interface of the downlink from an eNodeB to a UE is based upon an orthogonal frequency division multiplexing (OFDM) access radio interface. In an OFDM interface the resources of the available bandwidth are divided in frequency into a plurality of orthogonal subcarriers and data is transmitted in parallel on a plurality of orthogonal subcarriers, where bandwidths between 1.4 MHZ and 20 MHz bandwidth may be divided into orthogonal subcarriers. Not all of these subcarriers are used to transmit data (some are used to carry reference information used for channel estimation at the receiver for example) whilst some at the edge of the band are not used at all. For LTE, the number of subcarriers varies between 72 subcarriers (1.4 MHz) and 1200 subcarriers (20 MHz), but it will be appreciated that for other wireless access interfaces, such as NR or 5G, the number of sub-carriers and the bandwidth may be different. In some examples the subcarriers are grouped on a basis of $2^n$, for example 128 to 2048, so that both a transmitter and a receiver can use an inverse and a forward Fast Fourier Transform to convert the sub-carriers from the frequency domain to the time domain and from the time domain to the frequency domain respectively. Each subcarrier bandwidth may take any value but in LTE it is fixed at 15 kHz.

As shown in FIG. 2, the resources of the wireless access interface are also temporally divided into frames where a frame 200 lasts 10 ms and is subdivided into 10 sub-frames 201 each with a duration of 1 ms. Each sub-frame 201 is formed from 14 OFDM symbols and is divided into two slots 220, 222 each of which comprise six or seven OFDM symbols depending on whether a normal or extended cyclic prefix is being utilised within OFDM symbols for the reduction of inter symbol interference. The resources within a slot may be divided into resource blocks 203 each comprising 12 subcarriers for the duration of one slot and the resource blocks are further divided into resource elements 204 which span one subcarrier for one OFDM symbol, where each rectangle 204 represents a resource element. The resource elements distributed in time within a sub-frame and frequency across the system bandwidth represent the communications resources of the system.

The simplified structure of the downlink of an LTE wireless access interface presented in FIG. 2, also includes an illustration of each sub-frame 201, which comprises a control region 205 for the transmission of control data, a data region 206 for the transmission of user data and reference signals 207 which are interspersed in the control and data regions in accordance with a predetermined pattern. The control region 205 may contain a number of physical channels for the transmission of control data, such as a physical downlink control channel (PDCCH), a physical control format indicator channel (PCFICH) and a physical HARQ indicator channel (PHICH). The data region may contain a number of physical channels for the transmission of data or control, such as a physical downlink shared channel (PDSCH), enhanced physical downlink control channel (ePDCCH) and a physical broadcast channel (PBCH). Although these physical channels provide a wide range of functionality to LTE systems, in terms of resource allocation and the present disclosure ePDCCH and PDSCH are most relevant. Further information on the structure and functioning of the physical channels of LTE systems can be found in [1].

Resources within the PDSCH may be allocated by an eNodeB to UEs being served by the eNodeB. For example, a number of resource blocks of the PDSCH may be allocated to a UE in order that it may receive data that it had previously requested or data which is being pushed to it by the eNodeB, such as radio resource control (RRC) signalling. In FIG. 2, UE1 has been allocated resources 208 of the data region 206, UE2 resources 209 and UE3 resources 210. UEs in an LTE system may be allocated a fraction of the available resources for the PDSCH and therefore UEs are required to be informed of the location of their allocated resources within the PDCSH so that only relevant data within the PDSCH is detected and estimated. In order to inform the UEs of the location of their allocated communications resource elements, resource control information specifying downlink resource allocations is conveyed across the PDCCH in a form termed downlink control information (DCI), where resource allocations for a PDSCH are communicated in a preceding PDCCH instance in the same sub-frame.

Figure 3:
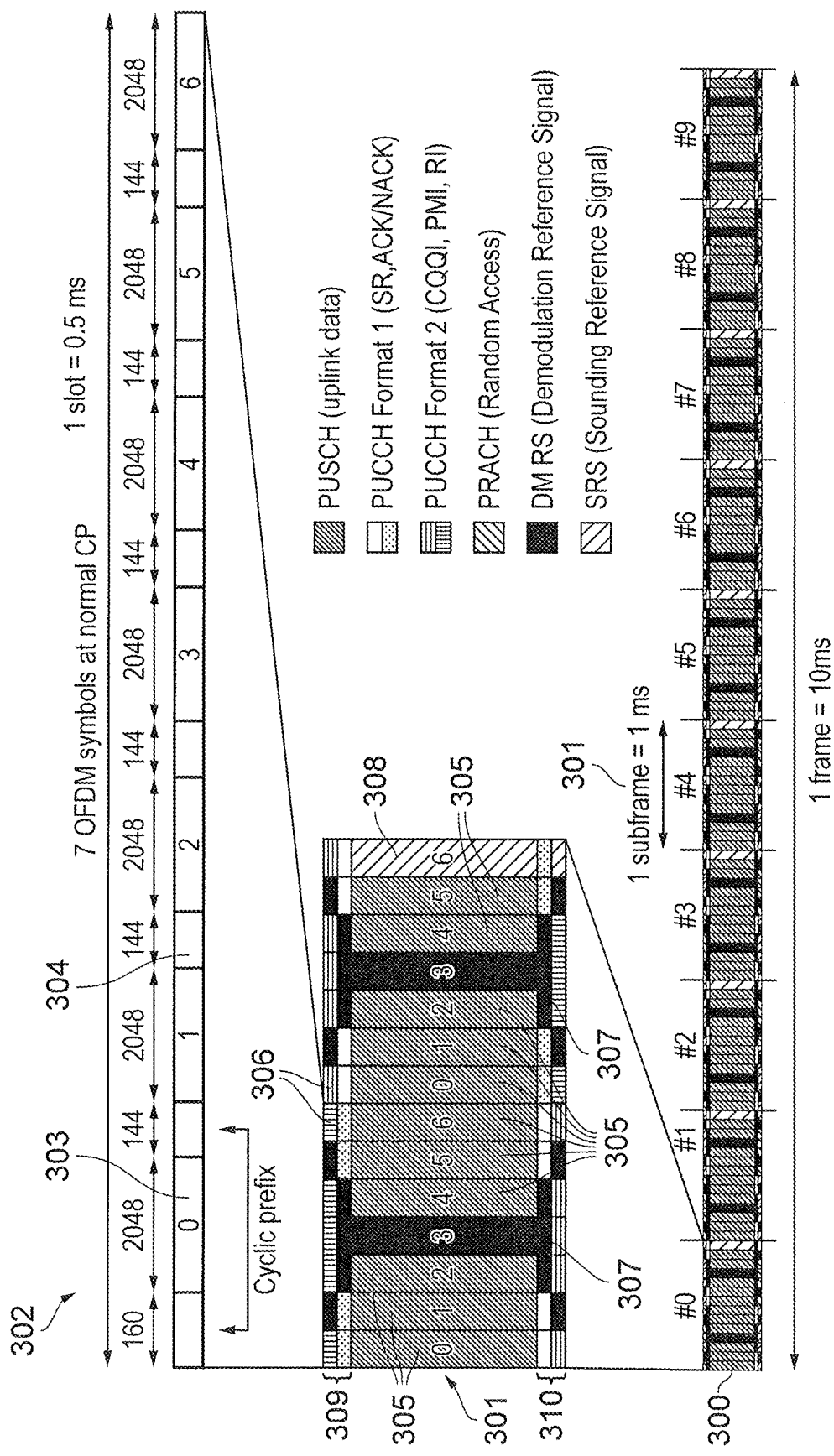
FIG. 3 provides a schematic diagram of an uplink of a wireless access interface of a mobile communications system operating according to an LTE standard.
Figure 4:
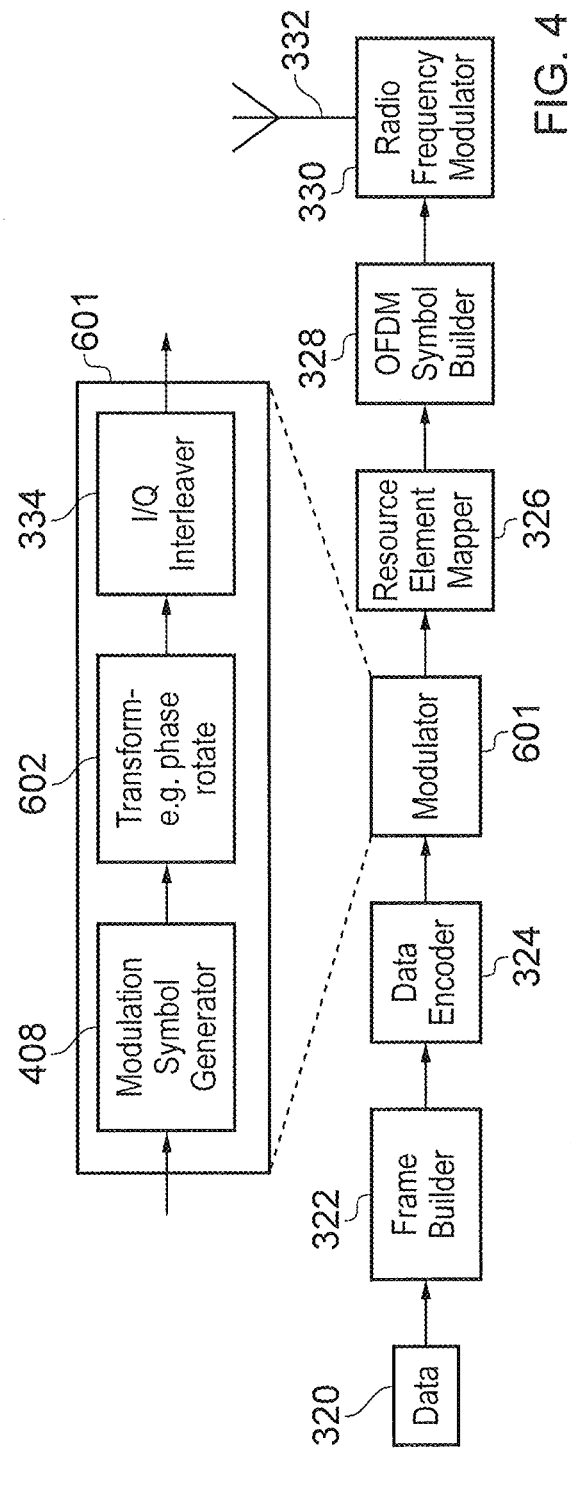
FIG. 4 is a schematic block diagram of an example of a transmitter which may form part of a communications device (UE) or a base station (eNodeB) of the wireless communications network shown in FIG. 1.

FIG. 3 provides a simplified schematic diagram of the structure of an uplink of an LTE wireless access interface that may be provided by or in association with the eNodeB of FIG. 1. In LTE networks the uplink wireless access interface is based upon a single carrier frequency division multiplexing FDM (SC-FDM) interface and downlink and uplink wireless access interfaces may be provided by frequency division duplexing (FDD) or time division duplexing (TDD), where in TDD implementations sub-frames switch between uplink and downlink sub-frames in accordance with predefined patterns. However, regardless of the form of duplexing used, a common uplink frame structure is utilised. The simplified structure of FIG. 4 illustrates such an uplink frame in an FDD implementation. A frame 300 is divided in to 10 sub-frames 301 of 1 ms duration where each sub-frame 301 comprises two slots 302 of 0.5 ms duration. Each slot is then formed from seven OFDM symbols 303 where a cyclic prefix 304 is inserted between each symbol in a manner equivalent to that in downlink sub-frames. More details of the LTE up-link represented in FIG. 3 are provided in Annex 1.

Physical Layer Transmission and Reception

Figure 5:
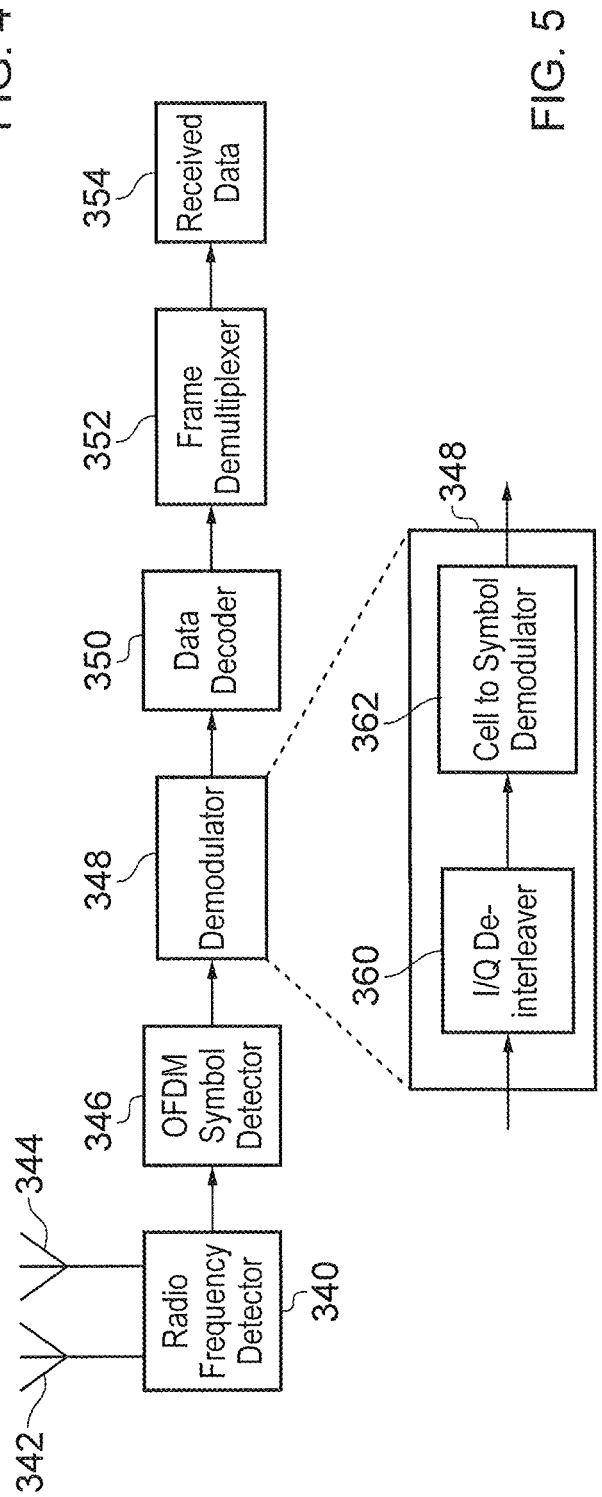
FIG. 5 is a schematic block diagram of an example of a receiver which may form part of a communications device (UE) or a base station (eNodeB) of the wireless communications network shown in FIG. 1.

Embodiments of the present technique find application in a transmitter and receiver which employs OFDM to transmit and receive data. As such, embodiments of the present technique can find application in a UE and an eNodeB of a wireless communications system, which may conform to an NR/5G standard or an LTE standard. An arrangement of signal processing blocks, which may be implemented as integrated circuits or processing units, which may be used to form part of physical layer processing in transmitters 110, 116 and receivers 112, 118 of a wireless communication system such as that of FIG. 1 are illustrated in FIGS. 4 and 5. FIGS. 4 and 5 will now be described in order to gain a better appreciation of the embodiments described in the following paragraphs.

As shown in FIG. 4 a data source 320 feeds data to be transmitted via the wireless access interface in for example the eNodeB to a frame builder 322. The frame builder 322 forms the data from the data source 320 into data units for transmission in one or more subframes of the wireless access interface. A data encoder 324 receives each data unit and performs encoding and scrambling to improve the integrity of the transmitted data and to provide some rejection of co-channel interference. The encoded data is then received at a modulator 601 which maps the data onto modulation symbols and performs other processing tasks to convert the modulation symbols into modulation cells.

The term modulation cell is used to identify each unit of information or modulating element which is carried by one of the sub carriers of an OFDM symbol, which corresponds to one of the resource elements of the wireless access interface. The term modulation cell is also used to differentiate against the term modulation symbol, which is used to identify the modulating component used to represent data and exists before I/Q interleaving as explained in the following paragraphs.

The modulation cells generated by the modulator 601 are then received by a resource element mapper which maps the modulation cells onto the subcarriers of OFDM symbols 326 which in combination with the OFDM symbol builder 328 generates OFDM symbols. The OFDM symbols are then used to modulate a radio frequency carrier for transmission by an RF modulator 330 from the antenna 332.

As shown in FIG. 4 the modulator 601 includes a modulation symbol generator 408 which receives the encoded data from the data encoder 324 and maps the data onto modulation symbols. A transformation unit 602 is then arranged to introduce a phase rotation to the modulation symbols. The modulation symbols are then processed by an I and Q interleaver 334 which converts the modulation symbols into modulation cells for mapping onto the resource elements by the resource element mapper 326.

As shown in FIG. 5 at the receiver a radio frequency detector may detect the transmitted signal (from the base station or UE as appropriate) using a radio frequency detector 340. The radio frequency detector may in some configurations include a plurality of antennas 342, 344 which may provide a multiple input multiple output (MIMO) or single input, multiple output signal space diversity scheme. An OFDM symbol detector 346 then receives a baseband version of the signal detected by the radio frequency detector and recovers the OFDM symbols and demodulates the subcarriers to generate for each sub-carrier a received modulation cell. The modulation cells are received by a demodulator 348. The demodulator 348 performs all the processing required to convert the received modulation cells into the modulation symbols, including I/Q deinterleaving, and maps the modulation symbols into data carried by the modulation symbols in accordance with the modulation scheme used at the transmitter. In other implementations, the demodulator can perform I/Q deinterleaving and directly convert the modulation cells into received data, without the intermediate step of reconstructing modulation symbols. The received data is then fed to the data decoder 350 which performs error correction decoding and descrambling to reverse the operations performed at the transmitter by the data encoder 324 in order to improve the integrity of the received data. A frame demultiplexer 352 then reassembles the data units into the data as presented by for example a higher layer application which is forwarded to a data sink 354.

As shown in FIG. 5 the demodulator 348 includes an I and Q deinterleaver 360 which deinterleaves the I and Q components and reforms the I and Q components into the modulation symbols from the modulation cells and performs a cell to symbol demodulator 362 into the data represented by each of the modulation symbols.

Figure 6:
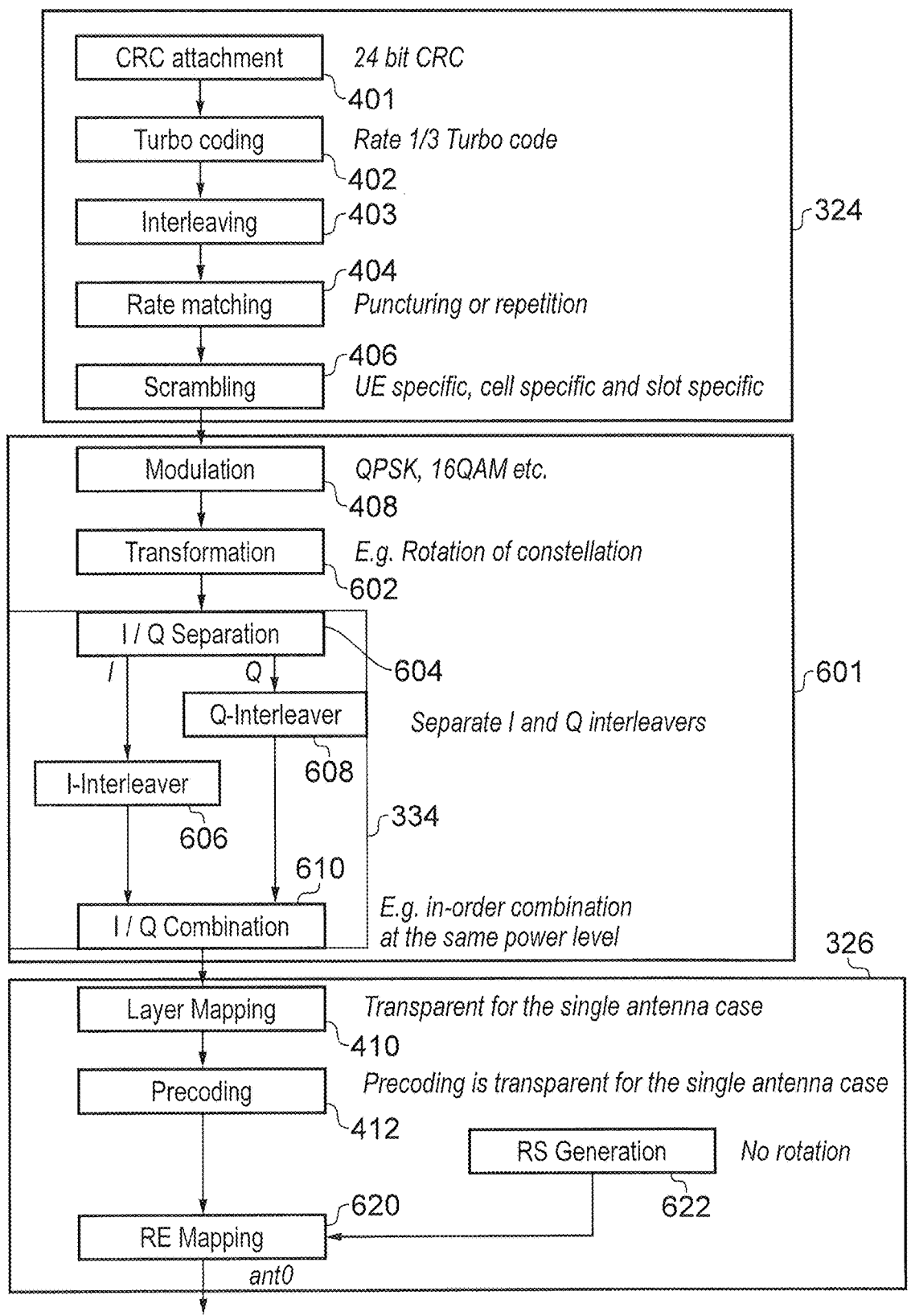
FIG. 6 is part schematic block diagram, part flow diagram illustrating process steps or transmitter blocks which form part of the transmitter in a base station or a communications device shown in FIG. 4.

FIG. 6 provides a more detailed representation of the processes which may form part of the data encoder 324, the modulator 601 and the resource element mapper 326 in order to provide a better understanding of signal space diversity and in particular the I and Q interleaving of the modulation symbols. Within the data encoder 324, the data to be transmitted is received at a first processing element 401 which performs a cyclic redundancy check to add bits to a data unit in order to confirm a successful transmission or identify a data unit which has been corrupted. Next, turbo encoding 402 is performed to add redundancy to the data unit using for example a third rate turbo code to encode the data unit. The turbo encoded data unit is then interleaved 403 in accordance with a known pattern whereby the interleaver interleaves systematic and parity bits that are produced by the Turbo encoder 402. The known pattern applied by the interleaver is adaptable to the number of physical bits that are eventually transmitted. Rate matching 404 is then applied followed by scrambling 406 which is UE specific, cell specific and slot specific in order to reduce interference, e.g. intercell interference between transmissions from different eNodeBs.

The bits of the turbo encoded and scrambled data unit are received at the start of the modulation step 408 performed by the modulator 601 and are mapped onto modulation symbols in accordance with a selected modulation scheme such as QPSK, 16QAM or 64 QAM. As disclosed in our co-pending International patent application number PCT/GB2015/053440 a transformation 602 receives the modulation symbols generated by the modulation step 408 and performs a transformation of the symbols, for example by applying a phase rotation. The degree of rotation is known to the UE and the eNodeB. The phase rotation can be for example an optimum rotation (or optimized) angle derived for each signal constellation. For example the optimum rotation angle for BPSK may be 45 degrees and for QPSK may be 22.5 degrees. The rotation angles used can be decided by the eNodeB according to eNodeB implementation algorithms. In order to reduce the number of potential rotation angles, the eNodeB may signal a quantised version of the rotation angle or an index into a table of rotation angles. In other examples, the transformation could be a reflection, constellation rearrangement (whereby the bit labelling of the constellation points is changed), other non-linear transformations of the signal space, a linear transform of the constellation point (moving signal points in the I and Q dimensions by known scaling factors) and combinations of these techniques. In another example, each rotated modulation symbol can be formed by designating a set angle as A and then each modulation symbol is rotated to become a multiple of each modulation symbol by multiplying the complex modulation symbol by the complex parameter $e^{jA}$.

The transformed modulation symbols are then subjected to I and Q interleaving in a combination of process steps 604, 606, 608, 610. At a first step 604 the modulation symbols received from the transformation step are separated into their real or in-phase I, and their imaginary or quadrature phase Q components. Each of these components is then interleaved separately by I and Q interleaving steps 606, 608 before the interleaved I and Q components are recombined to soft modulation cells for mapping onto an OFDM symbol by an I/Q combiner step 610. Our co-pending International patent application PCT/GB2015/053440 provides more detail relating to I/Q interleaving, the content of which is incorporated herein by reference. In brief summary, the purpose of the I/Q-Interleaver in signal space diversity coding schemes is to maximally separate, or at least increase the separation of, the I and Q components in the time/frequency grid such that if there is frequency selective fading or there are high speed channels (where fading occurs between OFDM symbols within the subframe), it is unlikely that both the I and the Q components are together subjected to the fading. I/Q interleaving schemes can include a random interleaving or deterministic interleaving. In some embodiments, one of the I-Interleaver and Q-Interleaver functions is a "pass through" function and interleaving is only performed in one interleaver.

The modulation cells are then fed to the resource element mapper 326, which performs layer mapping 410 which maps the modulation symbols onto a single layer for a transmission mode using a single antenna (antenna 332 shown in FIG. 4) referred to as TM1. In other examples (not shown in FIG. 6) two layers may be used in a second transmission mode referred to as TM2, in which even-numbered modulation symbols are applied to layer 0 and odd-numbered modulation symbols are applied to layer 1. In TM2 Alamouti encoding may be performed on the modulation symbols streams from each layer before the respective modulation cells of the Alamouti pairs are mapped on to separate antennas. For both TM1 and TM2 a pre-coding unit 412 performs pre-transmission coding operations such as Alamouti coding for the TM2 case. Reference signals which are generated and mapped within the time and frequency domain for transmission of the data unit within the subframe are generated by reference signal generator 622 and used to modulate selected sub-carriers of OFDM symbols, which are transmitted from each of the different antennas.

Figure 7:
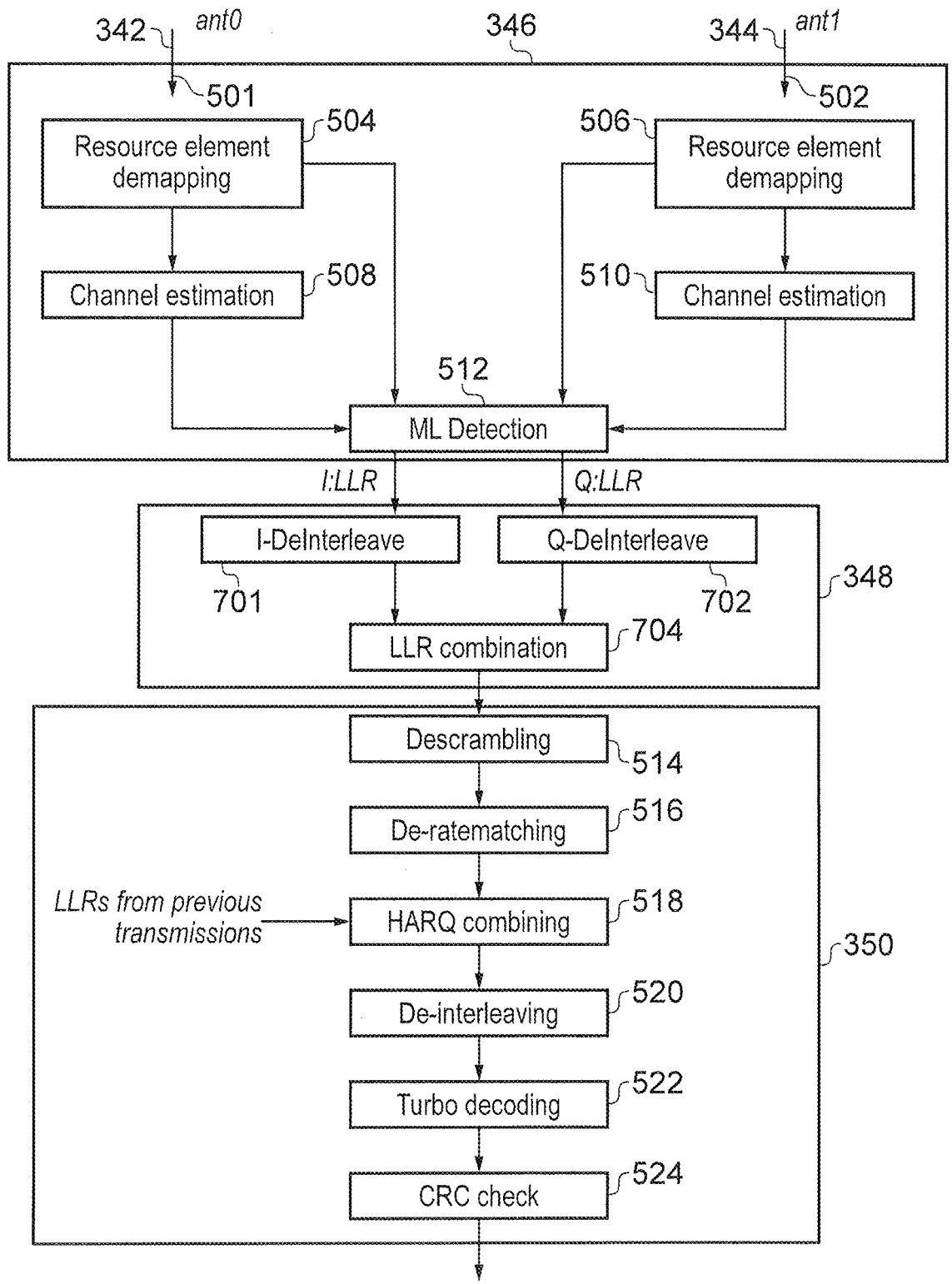
FIG. 7 is a part schematic block diagram, part flow diagram illustrating process steps or blocks of a receiver in part of the base station or the communications device shown in FIG. 5.

A more detailed illustration of some of the corresponding parts of the receiver shown in FIG. 5, which are relevant to the explanation of the signal space diversity techniques, is shown in FIG. 7. FIG. 7 provides a schematic block diagram, part flow diagram of processing or components which may be included in the OFDM symbols detector 346, the demodulator 348 and the data decoder 350 of the receiver shown in FIG. 5. As shown in FIG. 7 each of the first and second antennas 342, 344 is arranged to detect a signal which is fed from a channel 501, 502 respectively to a resource element de-mapping unit 504, 506. Channel estimation is performed by channel estimators 508, 510, for each of the respective channels using the received reference symbols before the combined signals from the first and second channels are combined by a maximum likelihood (ML) detection unit 512. When the transmissions use SSD, then the detection unit 512 also executes PAM (pulse amplitude modulation) demapping per constellation component to produce two sets of LLRs. The output of the detection unit 512 is a set of log likelihood ratios (LLRs) for each of the I and Q components of the received modulation cells carried by the sub-carriers of the OFDM symbols. The number of LLRs per component, m, is the same as the number of bits per symbol of the used constellation, for example m=2 for QPSK, m=4 for 16QAM, m=6 for 64QAM etc.

As shown in FIG. 7 the demodulator 348 shown in FIG. 5 comprises an I-component deinterleaver 701 and a Q-component deinterleaver 702 and an LLR combiner 704. The I and Q deinterleavers 701, 702 serve to perform a reverse of the I and Q interleaving performed at the transmitter with units of m LLRs per resource element. The LLR combiner 704 recombines the I and Q component LLRs to form a single set of m LLRs for each modulation symbol which are then converted into an estimate of the data transmitted for decoding by the data decoder 350.

The data decoder 350 includes a descrambling element 514 which descrambles the data in accordance with the cell, UE and slot specific scrambling applied in the transmitter in step 406. De-rate matching is then performed to reverse the puncturing or repetition formed by the rate matching unit 404 in the transmitter and the log likelihood ratios for the received data unit are then combined in a buffer of a hybrid automatic repeat request (HARQ) process 518 in order to decode the encoded data unit according to the third rate turbo code. Bit de-interleaving is then performed 520 on the LLRs followed by turbo decoding 522 and the CRC check performed by a CRC checking unit 524.

Maximum I/Q Interleaving

As disclosed in our co-pending International patent application PCT/GB2015/053440 an I/Q interleaver is arranged maximally to separate the I and Q components of the modulation symbols in the resource element domain. That is to say, the I-samples and Q-samples are maximally separated in time and frequency from one another. This has a benefit of providing robustness against localised fading (in the time or frequency domains). Furthermore, the I-Interleaver and Q-Interleaver are dimensioned to interleave a number of samples that is consistent with the amount of physical resource used for the transmission. The interleavers used in LTE, such as the sub-block interleaver that is specified in 3GPP TS36.212 section 5.1.4.1.1 are already arranged to interleave data on the basis of a sub-block.

The I/Q interleaving proposed in PCT/GB2015/053440 interleaves the I-samples and Q-samples across the entire amount of physical resource, in order to achieve this maximal separation of the I and Q components of the modulation symbols. This maximal separation arrangement across an allocated physical resource block is illustrated in FIG. 8 for I-components and FIG. 9 for Q-components, which also appear in FIGS. 9 and 10 in PCT/GB2015/053440.

Figure 8:
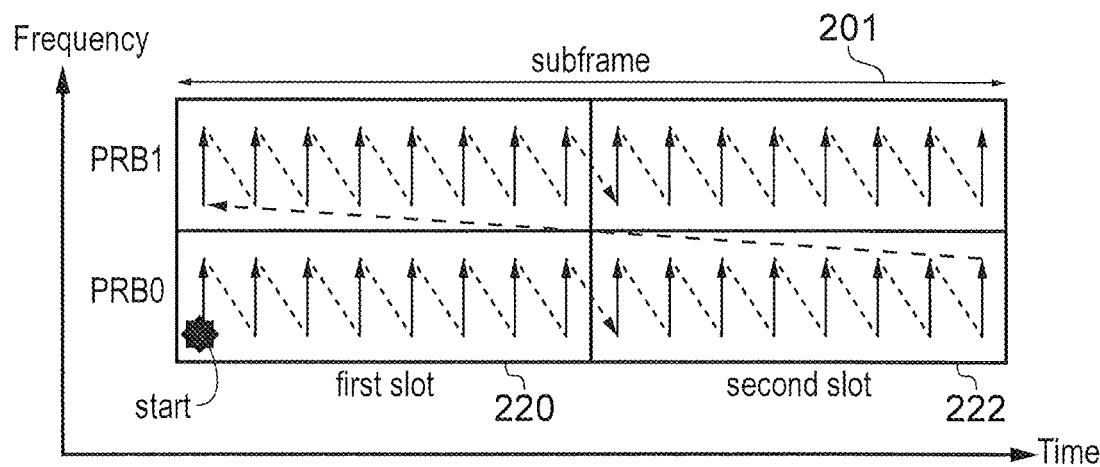
FIG. 8 is an illustrative representation of resource element mapping of the real components of the signal samples of the modulation symbols.
Figure 9:
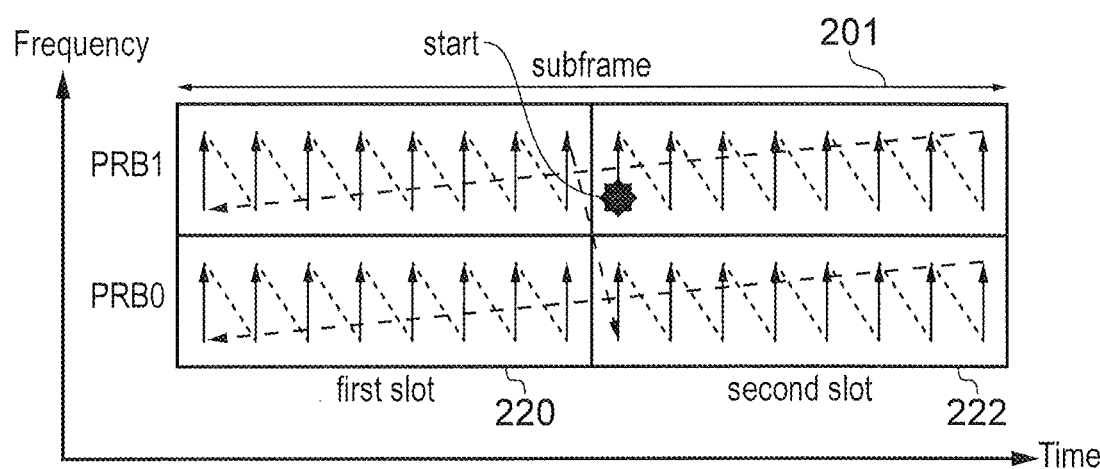
FIG. 9 is an illustrative representation of mapping of resource elements to the imaginary component of the signal samples of modulation symbols.

FIG. 8 shows the order that I-samples at the output of the modulator are mapped to resource elements of a pair of physical resource blocks (PRB) in a sub-frame 202 according to the described I-interleaver functionality. This interleaver is a "straight-through" interleaver since the order of mapping of I-samples to resource elements is the same as the mapping of modulation symbols to resource elements in the legacy LTE mapping. FIG. 9 shows the order that the Q-samples at the output of the modulator are mapped to resource elements according to the described Q-interleaver functionality. This Q-interleaver maximally separates I-samples and Q-samples in time and frequency.

As will be appreciated from the I/Q interleaving arrangement disclosed in PCT/GB2015/053440, an advantage of maximally separating I-samples from Q-samples in frequency is that frequency separation provides robustness against fading of both I-samples and Q-samples of a modulation symbol in frequency selective channels. Maximally separating in time provides robustness against time varying fading, when the I-samples and Q-samples are mapped to OFDM symbols at times that exceed the coherence time of the channel. However the interleavers disclosed in PCT/GB2015/053440 have a drawback in that memory is required at the front-end of the receiver in order to buffer received I-samples and Q-samples before LLRs of bits encoded on modulation symbols can be derived. The sizes of the buffers for these interleavers are sufficient to accommodate I-samples and Q-samples for each resource element of the physical resources allocated to the UE.

It will be appreciated that the interleaving patterns shown in FIG. 8 and FIG. 9 are illustrative of one example interleaving pattern and that other interleaving patterns can be applied. For example, the I-Interleaver can map resource elements in a strictly frequency-first, time-second order, while the secondary interleaver can map in a circular strictly frequency-first, time-second order with mapping starting at PRB1 in the second slot.

The memory requirements of the I-deInterleave and Q-deInterleave functions have two deleterious effects:
  Increase in UE complexity, due to the increased buffering requirements in the receiver.
  Increase in decoding latency. The latency can have a significant impact on the ability to support ultra-reliable low latency communications (URLLC), where it is desirable to have a processing chain that implements "on the fly processing": as soon as one symbol is decoded, the results of that decoding can be sent to the next processing stage Improved Transmission/Reception Using Segmentation Combined with I/Q Interleaving Embodiments of the present technique can provide an arrangement in which the Q-Interleaver and I-Interleaver for signal space diversity operate to interleave the I-samples and/or Q-samples on a smaller number of modulation symbols than that proposed in our earlier disclosure of PCT/GB2015/053440, which may be configurable and may be for example on the basis of an OFDM symbol-by-symbol basis or part thereof or an integer number of OFDM symbols, rather than interleaving the modulation symbols of the entire physical resource allocated to a communications device such as for example a whole subframe of I-samples and/or Q-samples.

In an embodiment of the present technique, the I-Interleaver 606, Q-Interleaver 608 and/or the resource element mapping 326 of FIG. 6 are modified. In one example, the I-Interleaver is a pass-through interleaver and the Q-Interleaver performs interleaving on an OFDM symbol-by-symbol basis. The resource element mapper 326 then maps resource elements in a frequency first and OFDM symbol-second order.

Figure 10:
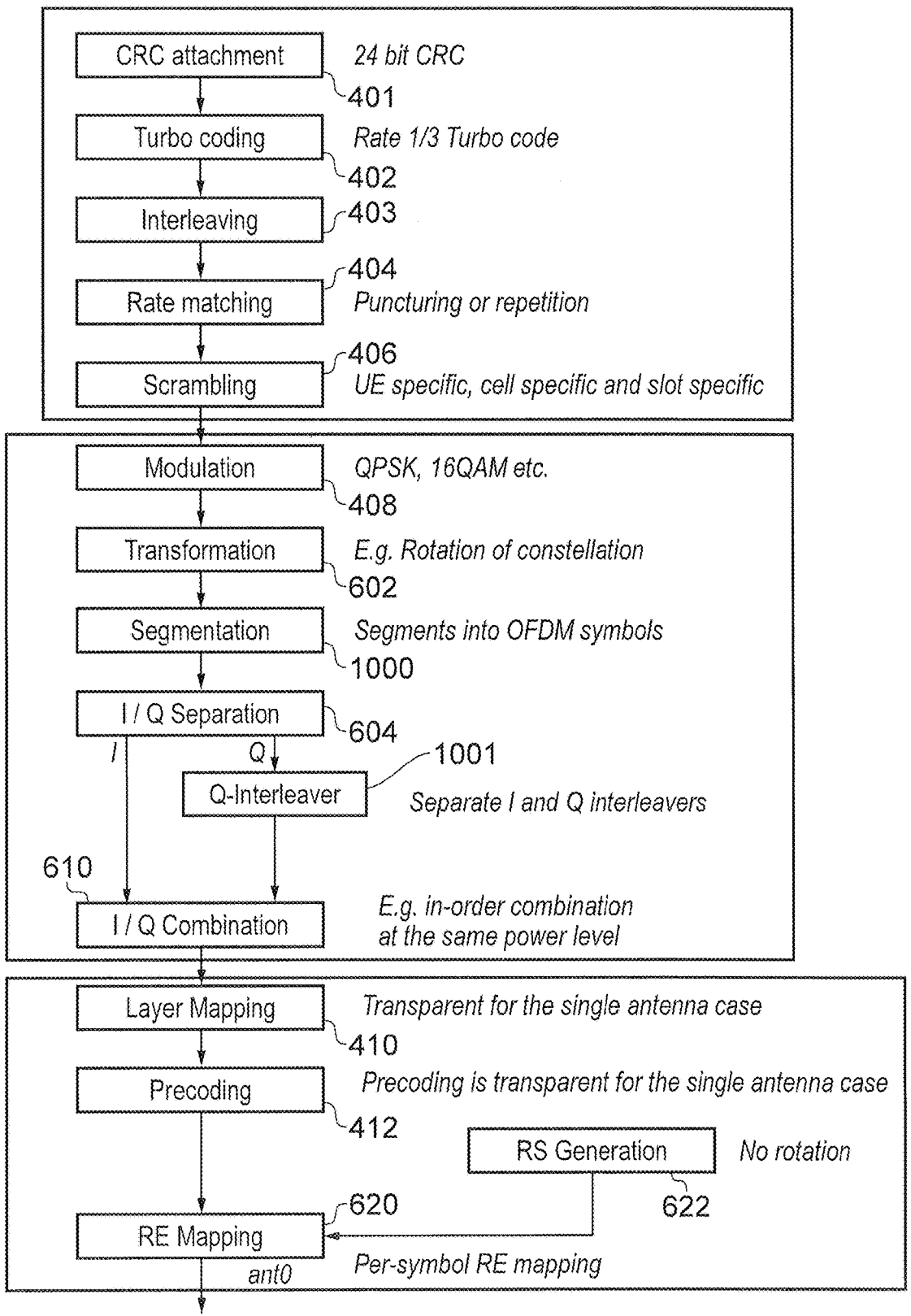
FIG. 10 is a part schematic block diagram, part flow diagram illustrating process steps or transmitter blocks of a transmitter chain corresponding to the example shown in FIG. 6 but adapted in accordance with the present technique.

FIG. 10 corresponds to the transmitter block diagram shown in FIG. 6 but adapted in accordance to the present technique. Those process steps or blocks shown in FIG. 10 that bear the same numerical designations in FIG. 6 perform a corresponding function to the embodiment shown in FIG. 6 and so only differences with respect to FIG. 6 will now be explained. As shown in FIG. 10 after the transformation of the modulation symbols by the transformation step 602 and before the I and Q interleaving step that is initiated in the I/Q separation step 604, a segmentation circuit or process 1000 is provided. The segmentation circuit or process 1000 forms the modulation symbols into segments of modulation symbols for transmission. Each segment is arranged to comprise the modulation symbols for transmission via an integer number of the one or more OFDM symbols. Accordingly, the I/Q separation circuit or process 604 receives a segment of modulation symbols corresponding to an integer number of one or more OFDM symbols for transmission, for example, in any one subframe 202. The I/Q separation 604 and the I/Q combination 610 correspond to those steps correspondingly shown in FIG. 6. However, the I samples are passed through, that is to say that they are not interleaved and the Q interleaver operates to interleave the Q samples only within the modulation symbols of the segment. Thus, I and Q interleaving is performed only for the modulation symbols which are to be transmitted on the OFDM symbols that correspond to each segment. The I/Q Interleaving function is then performed for each segment of the transmission. For example, when the segment size corresponds to one OFDM modulation symbol and there are 12 OFDM modulation symbols used to carry PDSCH, twelve segments are processed, i.e. the I/Q Interleaving function operates twelve times, one time for each segment.

According to the present technique, the segmentation function takes the input modulation symbol stream and segments it into strings of modulation symbols that are of a length equal to the number of modulation symbols that can be mapped to each OFDM symbol. The number of modulation symbols that can be mapped per OFDM symbol differs from OFDM symbol to OFDM symbol because some OFDM symbols contain only data-bearing modulation symbols while other OFDM symbols contain both data-bearing and reference signal bearing modulation symbols.

As an example, consider the case where TM1 is applied (i.e. there is one active antenna port), two OFDM symbols are occupied by the control channel region (PDCCH, PHICH, PCFICH) and PDSCH is mapped to six PRB-pairs. In this case, the physical resources are applied to twelve OFDM symbols numbered 2 to 13 in the subframe, noting that the 14 OFDM symbols in the LTE subframe are numbered from 0 to 13 inclusive. A single physical resource block (PRB)-pair spanning a single subframe 202 of the resource allocation can be seen from FIG. 2, for example the allocation 209 is an allocation of a single PRB-pair.

The table below indicates the number of data-bearing modulation symbols per OFDM symbol for TM1 and a six PRB-pair allocation:

| OFDM symbol | Number of data-bearing modulation symbols |
| --- | --- |
| 0, 1 | 0 |
| 2, 3, 5, 6, 8, 9, 10, 12, 13 | 72 |
| 4, 7, 11 | 60 |

Hence according to an example embodiment, the segmentation function segments the input modulation symbol stream into segments of length 72,72,60,72,72,60,72,72,72, 60,72,72 modulation symbols.

I/Q Interleaver

According to an example embodiment of the present technique each segment of modulation symbols is interleaved separately to form the modulation cells for mapping onto an integer number of OFDM symbols of the segment. In other words, the Q-Interleaver and I-Interleaver operate on an OFDM-symbol by OFDM-symbol basis (or equivalently on a segment by segment basis).

In one example of the Q-Interleaver and I-Interleaver, the I-Interleaver is a pass-through interleaver and the Q-Interleaver operates to map the Q-samples to a position in the resource space that is shifted by half the frequency resource space. This functionality can be achieved by writing the I-samples and Q-samples into a circular buffer as illustrated by the example shown in FIG. 11.

Figure 11:
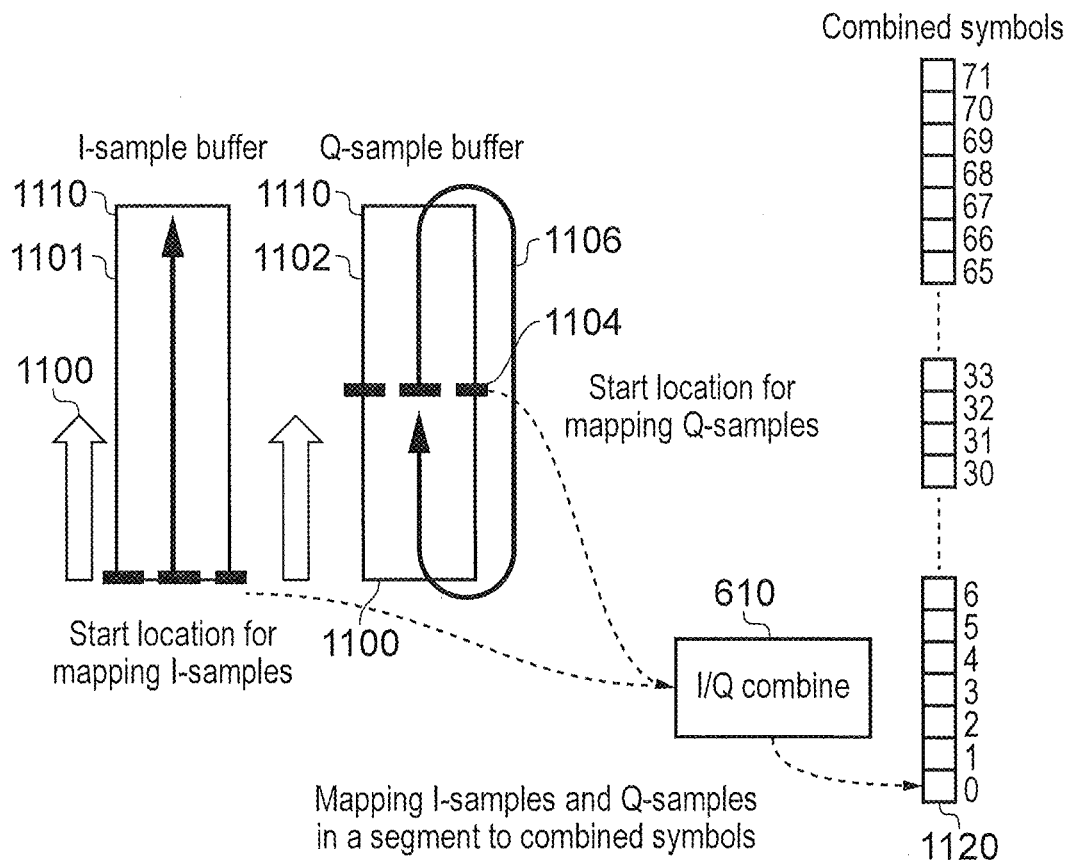
FIG. 11 is a schematic illustration part flow diagram of an example of an I-/Q-interleaver according to an example embodiment of the present technique.

As shown in FIG. 11, the I and Q samples are written in a sequential order into an I sample buffer 1101 and a Q sample buffer 1102 starting from a first memory location 1100 and ending at the last memory location 1110. However, whilst the I samples are read out in the sequential order starting from the first memory location 1100 and ending in the last memory location 1110 the Q samples are read out from the Q buffer 1102 starting at a middle location 1104 of the buffer 1102 and as shown by an arrow 1106 reading the Q samples sequentially from the middle part of the buffer 1104, but in circular fashion. Thus, the first of the Q samples are read out in addresses from the middle point 1104 and higher whereas the second half of the Q samples are read from the start of the buffer 1100 to the middle 1104. Thereafter, the I/Q samples are recombined by a combiner 610, by combining the I and Q samples from the buffers 1101, 1102 and stored in resource elements 1120 forming the modulation cells for transmission. As such, when the I and Q combiners 610 recombine the I and Q samples into the modulation cells in the corresponding resource element storage locations 1120, each of which corresponds to one of the sub carriers of the OFDM symbol on which the modulation cells are to be carried, the modulation cells will have I and Q samples from different modulation symbols in accordance with the I and Q interleaving scheme. The example shown in FIG. 11 is therefore arranged to read out the I-samples cyclically from the bottom of the circular buffer 1101 into the resource space 1120 and read the Q-samples cyclically from the half way point of the circular buffer 1102 into the resource space 1120.

In summary and considering an example in which a segment is comprised of an OFDM symbol, and the current OFDM symbol carries 72 resource elements to which the I-samples and the Q-samples are mapped, an I/Q interleaver according to the example shown in FIG. 11 can be arranged so that:

I-samples are stored in an I-sample circular buffer. The I-samples come from 72 modulation symbols within a segment of the modulation symbol stream of the transport channel processing chain of FIG. 10.

Q-samples are stored in a Q-sample circular buffer. The Q-samples come from 72 modulation symbols within a segment of the modulation symbol stream of the transport channel processing chain of FIG. 10.

The I-samples are read out from the base of the I-sample buffer, starting at the bottom of the buffer, whereas the Q-samples are read out from the half-way point of the Q-sample buffer (i.e. from Q-sample index number 36)

Since the number of resource elements available for data modulation symbols varies from OFDM symbol to OFDM symbol (e.g. due to some OFDM symbols containing reference signals as shown in FIGS. 2 and 3), the dimensions of the circular buffers of FIG. 11 may differ from OFDM symbol to OFDM symbol. For example, referring to FIG. 11, for TM1, the interleaver size per OFDM symbol is as shown in the second column of Table 1.

The combined symbols are then processed according to the transport and physical channel processing chain of FIG. 10. In this processing chain, layer mapping and precoding operations are performed.

In the above description the Q sample is interleaved whilst the I sample is not interleaved (i.e. a pass through). It should be appreciated that only one of the I/Q samples needs to be interleaved and that the idea is also applicable if the Q sample is NOT interleaved (i.e. a pass through interleaver) whilst the I sample is interleaved. As explained above, the I/Q combination function or circuit 610 operates to create individual modulation cells within a segment from the modulation symbols (before I/Q interleaving). The segments can be combined into a single stream following I/Q combination, but this single stream can be segmented again after precoding to create separate streams for each OFDM symbol.

Resource Element Mapping

As explained above and according to embodiments of the present technique, the resource element mapping stage or mapping circuit 620 is correspondingly adapted so that modulation cells of each segment are mapped to the resource elements of a same corresponding number of OFDM symbols. In a simple embodiment, for each of the OFDM symbols, the first modulation cell of the segment is mapped to the first resource element of the OFDM symbol (i.e. the lowest frequency subcarrier), the second combined modulation cell is mapped to the second resource element etc. More elaborate resource element mapping schemes can provide an arrangement in which even numbered OFDM symbols are mapped to resource elements numbered from bottom to top and odd numbered OFDM symbols are mapped to resource elements going from top to bottom. There may also be interleaving functions in the resource element mapping function that further interleaves the combined OFDM symbols.

OTHER EXAMPLE EMBODIMENTS

In other examples the transmitter of FIG. 11 is configured to provide an extended coverage function. In order to extend coverage of the transmitted data, the segments which are formed by the segmentation circuit or process 1000 are repeated. For example, when twelve OFDM symbols are available for data transmission, the input transport block is rate matched to an amount of resource equivalent to six OFDM symbols. After the segmentation function, each segment is repeated, which therefore creates twelve segments that can be mapped to twelve OFDM symbols. Hence a segment segment_A will be repeated to create segment_A1 and segment_A2. In one example the segment_A1 and segment_A2 are configured so that:

Segment_A1: The start location for mapping I-samples is the first I-sample and the start location for mapping Q-samples is the "half-way" Q-sample (as shown in FIG. 7).

Segment_A2: The start location for mapping I-samples is the "half-way" I-sample and the start location for mapping Q-samples is the first Q-sample In other words, the interleaving applied to the repeated I-samples and Q-samples differs between segments. This embodiment has the advantage of ensuring that between repetitions, there is frequency diversity for each I-sample and each Q-sample.

In another example embodiment, the memory size of the I-interleaver and Q-interleaver may vary as a function of a UE's capability. The memory size of the I- and Q-interleavers 604, 1001 may be signalled by the UE to the eNodeB or pre-configured as defined in the specifications. The segment size is then a function of that UE capability. The number of OFDM symbols in each segment can therefore be configured in correspondence with the memory size, so that the segment size can be greater than one OFDM symbol if there is sufficient interleaver memory to store modulation cells for more than one OFDM symbol. For example, a UE may have an interleaver memory sufficient to store 144 I-samples/Q-samples. In this case, when the UE is allocated six physical resource blocks (PRBs) with 72 subcarriers per OFDM symbol, the segment size can cover two OFDM symbols. For the case where the I-sample interleaver is a "pass-through" interleaver, the I-samples and Q-samples can be mapped as follows:

| I-sample number | Q-sample number | Mapped OFDM symbol | Mapped subcarrier |
|---|---|---|---|
| 0 | 72 | 0 | 0 |
| 1 | 73 | 1 | 0 |
| 2 | 74 | 0 | 1 |
| 3 | 75 | 1 | 1 |
| 4 | 76 | 0 | 2 |
| ... | ... | | |
| 71 | 143 | 1 | 35 |
| 72 | 0 | 0 | 36 |
| 73 | 1 | 1 | 36 |
| ... | ... | | |

The above mapping provides some time diversity for the I-samples and Q-samples, as well as the frequency diversity provided in the arrangement of FIG. 10.

In an embodiment of the invention, the I/Q sample interleaver/deinterleaver sizes are known through UE capability and the number of OFDM symbols that a segment is mapped to depends on the allocation given to the UE (via DCI=Downlink Control Information signalling). The number of symbols can be signalled:

Explicitly using a field in the DCI, indicating the number of OFDM symbols to which a segment should be mapped.

Implicitly. For example, the number of OFDM symbols to which a segment is mapped is a function of the number of PRB-pairs that are assigned to the UE. E.g. If the UE has a UE capability for 72 I-samples/Q-samples:
  If the UE is scheduled with 6PRB-pairs (72 subcarriers), segments are mapped to one OFDM symbol
  If the UE is scheduled with 3PRBs (36 subcarriers), segments are mapped to two OFDM symbols
  If the UE is scheduled with 2PRBs (18 subcarriers), segments are mapped to three OFDM symbols In another example embodiment, the eNodeB schedules the UE with a smaller number of subcarriers at higher UE speeds, in order to increase the time diversity of the signal space diversity (e.g. the implicit derivation of the number of OFDM symbols in the segment, as described above, causes an increased number of OFDM symbols to be used in the segment, thus increasing time diversity). This will reduce the throughput achievable to these high speed UEs (less physical resource is assigned per subframe), but the robustness to those UEs is improved (through increased signal space diversity gains).

In other examples, there may be a limited set of numbers of OFDM symbols to which the I-samples and Q-samples can be assigned. For these examples, interleaver structures can be defined for each of the numbers of OFDM symbols. For example, interleaver structures could be defined for one OFDM-symbol and twelve OFDM-symbols. When it is determined that the UE is operating at a low speed, the one OFDM-symbol form of signal space diversity can be used with the one OFDM symbol I-sample and Q-sample interleavers, as discussed for the example embodiment shown in FIG. 11. When it is determined that the UE is operating at high speed, the twelve OFDM-symbol interleaver can be used, providing a lower data rate, but increased resilience (through signal space diversity time diversity). This embodiment can include twelve OFDM-symbol interleavers on the assumption that there are two control channel OFDM symbols. The embodiment can readily be adapted to the case where there are:

One OFDM-symbol interleavers as well as 11, 12, 13 OFDM symbol interleavers

One OFDM-symbol interleavers as well as a generic multi-OFDM-symbol interleaver (such as the generic multi-OFDM-symbol interleaver of PCT/GB2015/053440)

Gains from signal space diversity can be greater when the frequency separation of the I-samples and Q-samples is greater. In some example embodiments, the resource element mapper 620 shown in FIG. 10 maps I-samples and Q-samples to non-contiguous physical resource blocks. For example, for a UE with a limited baseband bandwidth capability of six physical resource blocks, but a wide bandwidth RF receiver of 50 physical resource blocks (10 MHz), the resource element mapper maps the combined symbols to physical resource blocks 0, 1, 2 and 47, 48, 49. This provides maximum frequency diversity of the I-samples and Q-samples. This is because the I-sample of a modulation symbol and the Q-sample of a modulation symbol can be separated by approximately 10 MHz, increasing the frequency diversity of the signal space diversity, as shown in FIG. 12.

Figure 12:
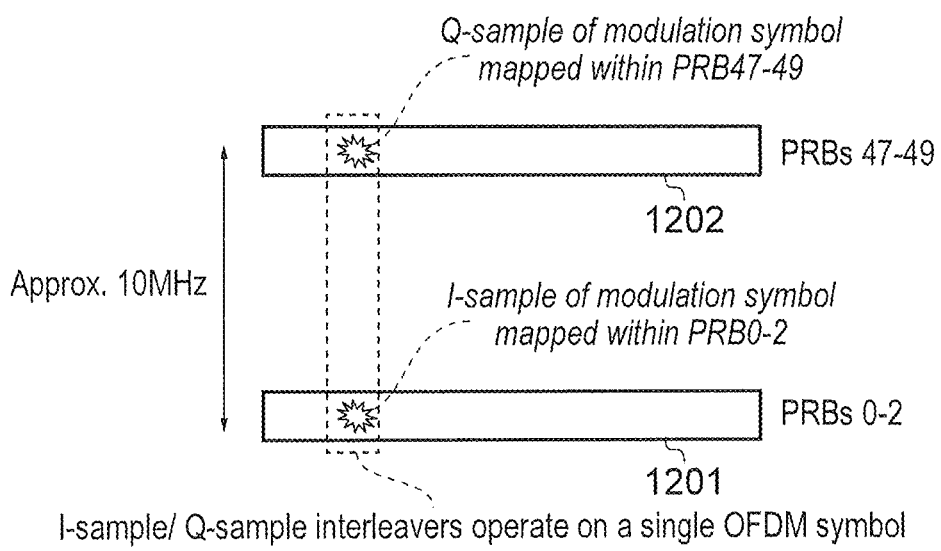
FIG. 12 is a schematic illustration of a mapping of I-samples and Q-samples onto physical resource blocks which are separated in frequency according to an example embodiment of the present technique.

As shown in FIG. 12, Q samples of a modulation symbol are mapped within a different frequency range to the I samples. Boxes 1201, 1202 represent a subframe of resource elements within different physical resource blocks. The resource elements in box 1201, represent resource elements from physical resource blocks numbered 0, 1 and 2, whereas the upper box 1202 represents resource elements from physical resource blocks numbered 47, 48 and 49. The physical resource blocks contained within 1201, 1202 are respectively at different ends of the downlink 201 bandwidth, and so by mapping different samples onto different OFDM symbols separated by a maximum amount of the frequency domain, in this example 10 megahertz, a greater frequency diversity can gained.

Figure 13:
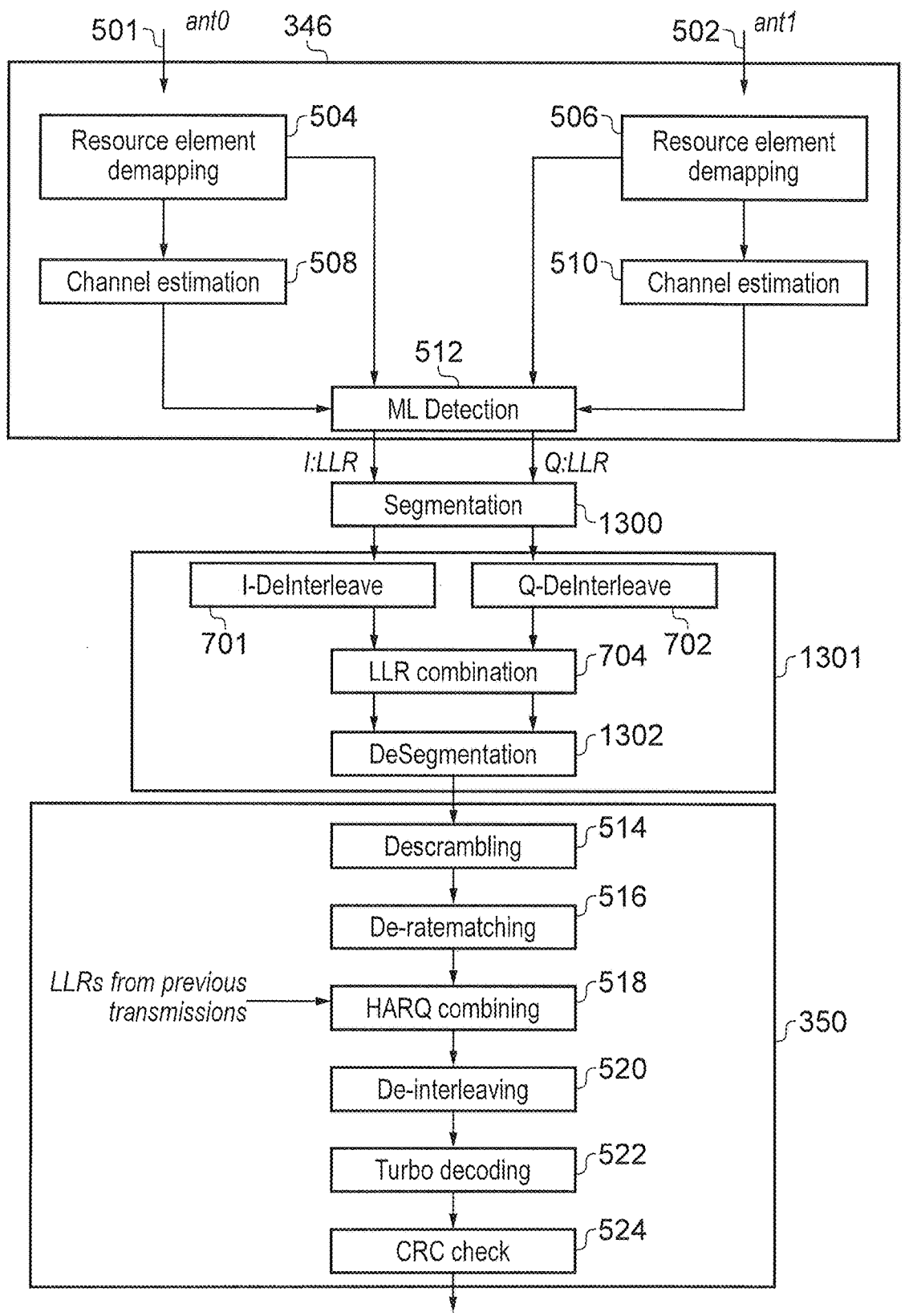
FIG. 13 is a part schematic block diagram, part flow diagram illustrating process steps or receiver blocks forming part of a space diversity processing chain corresponding to the example shown in FIG. 7 but adapted to provide a receiver embodying the present technique.

FIG. 13 provides an example illustration of an embodiment of the present technique when applied to a receiver. The example block diagram of the receiver shown in FIG. 13, corresponds to the receiver shown in FIG. 7 with corresponding elements having the same numerical references. As shown in FIG. 13, the receiver includes all of the elements of the receiver shown in FIG. 7 except that the demodulator 348 has been replaced by an adapted demodulator 1301 and includes a segmentation unit 1300, which receives the I and Q LLR samples from the OFDM symbols detector 346. The segmentation unit 1300 forms the I and Q LLR samples into segments of I and Q LLR values corresponding to the segments which were formed at the transmitter. The adapted demodulator 1301 includes the I and Q deinterleavers 701, 702 as well as the combiner 704, which correspond to the operations performed by those elements shown in FIG. 7. The I and Q deinterleavers 701, 702 therefore preform a reverse of the operation performed by the I and Q interleavers 1101, 1102, 1001 explained above with reference to FIGS. 10 and 11. The demodulator 1301 also includes a de-segmentation processor 1302, which receives the LLRs derived from the OFDM symbols of each segment and recombines them to create the input into the data decoder 350.

In some example embodiments the resource element demapping functions 504, 506 inherently segment the received resource elements into segments that the I-deInterleave 701 and Q-deInterleave 702 functions act upon, in which case the segmentation unit 1300 would not be required. In other example embodiments, the segmentation unit 1300 between the maximum likelihood detection stage 512 and the adapted demodulator 1301 forms the I and Q LLR samples into segments corresponding to those formed at the transmitter.

According to the embodiments described above, the segmentation circuitry 1300 is configured to receive the modulation cells from an integer number of the one or more of the OFDM symbols or part thereof and to form the modulation cells into segments of modulation cells. The I/Q de-interleaver circuitry 701, 702 is then configured to receive each of the segments of modulation cells and for each segment to separate real and imaginary components of the modulation cell for the segment and to de-interleave the real components of the modulation symbols of the segment differently to the imaginary components of the segment. The LLR combination unit 704 includes diversity combiner circuitry configured to combine the log-likelihood ratios output from the I component and Q component demodulation circuitry to demodulate the data of each segment. In one example the diversity combiner circuitry may be an adder, which adds the log-likelihood ratios together. The data of each segment is then formed back into a single LLR stream by the de-segmentation unit 1302.

Summary of Advantages

It will be appreciated from the above explanation that embodiments of the present technique can provide advantageous features with respect to the transmitters and receiver disclosed in our co-pending International patent application number PCT/GB2015/053440. For example, according to the above described embodiments the receiver and transmitter complexity are lower since the memory required for the I-Interleaver/Q-Interleaver and associated deinterleavers are lower. Furthermore the aforementioned interleavers/deinterleavers only need to have sufficient memory to store an integer number of OFDM-symbols' worth of I-samples and Q-samples, for example one OFDM-symbol's worth, or a part of an OFDM symbol's worth of I-samples and Q-samples, such that interleaving of modulation symbols is performed for less than a total number of modulation symbols which could be transmitted using communications resources of the wireless access interface (physical resource blocks) allocated for transmitting data.

Embodiments of the present disclosure can also provide an advantage because the decoding speed can be increased. The front-end processing of the received signal space diversity signals can be performed on an OFDM-symbol by OFDM-symbol basis, or an integer number of ODM symbols or part thereof, rather than requiring the UE to buffer a whole subframe before performing front-end processing functions.

It will be appreciated that the above description for clarity has described embodiments with reference to different functional units, circuitry and/or processors. However, it will be apparent that any suitable distribution of functionality between different functional units, circuitry and/or processors may be used without detracting from the embodiments.

Described embodiments may be implemented in any suitable form including hardware, software, firmware or any combination of these. Described embodiments may optionally be implemented at least partly as computer software running on one or more data processors and/or digital signal processors. The elements and samples of any embodiment may be physically, functionally and logically implemented in any suitable way. Indeed the functionality may be implemented in a single unit, in a plurality of units or as part of other functional units. As such, the disclosed embodiments may be implemented in a single unit or may be physically and functionally distributed between different units, circuitry and/or processors.

Although the present disclosure has been described in connection with some embodiments, it is not intended to be limited to the specific form set forth herein. Additionally, although a feature may appear to be described in connection with particular embodiments, one skilled in the art would recognize that various features of the described embodiments may be combined in any manner suitable to implement the technique.

Various further aspects and features of the present invention are defined in the following numbered paragraphs:

Paragraph 1. An infrastructure equipment of a wireless communications network for transmitting data to and receiving data from communications devices, the infrastructure equipment comprising transmitter circuitry configured to transmit signals to the communications devices via a wireless access interface formed by the infrastructure equipment, and controller circuitry configured to control the transmitter circuitry to form the wireless access interface to transmit data represented as the signals to one or more of the communications devices, the wireless access interface having a time divided structure of repeating time units, each of the time units comprising a predetermined number of resource elements disposed in time and frequency, and the transmitter circuitry comprises frame builder circuitry configured to receive the data to be transmitted to one of the communications devices, and to form the data into one or more data-blocks for transmission via one or more of the time-units of the wireless access interface, modulator circuitry configured to modulate a plurality of sub-carriers of one or more Orthogonal Frequency Division Multiplexed, OFDM, symbols with the data of each data-block in accordance with a modulation scheme, and mapping circuitry configured to map the sub-carriers of each of the one or more OFDM symbols onto the resource elements of the one or more time-units of the wireless access interface in the frequency domain for transmission, and radio frequency transmission circuitry configured to transmit each of the one or more OFDM symbols in the one or more time-units, wherein the modulator circuitry includes modulation symbol generator circuitry configured to receive the data and to generate modulation symbols representing the data, each modulation symbol for modulating a corresponding sub-carrier of the OFDM symbols in accordance with a modulation scheme, segmentation circuitry configured to receive the modulation symbols representing the data and to divide the modulation symbols into segments of modulation symbols for transmission, each segment of the modulation symbols for transmission via an integer number of the one or more OFDM symbols or part thereof, modulation rotation circuitry configured to receive the modulation symbols of one segment and to rotate each modulation symbol by an angle dependent on the choice of modulation scheme, I/Q interleaver circuitry, which is configured to receive each of the segments of rotated modulation symbols and for each segment to separate real and imaginary components of the rotated modulation symbols for the segment and to interleave the real components of the rotated modulation symbols of the segment differently to the imaginary components of the rotated modulation symbols of the segment, and I/Q combiner circuitry configured to re-combine the real and imaginary interleaved components of the rotated modulation symbols of each segment and to form from the real and imaginary components modulation cells, each modulation cell for modulating one of the plurality of sub-carriers of each of the integer number of one or more OFDM symbols or part thereof for the segment to be transmitted.

Paragraph 2. An infrastructure equipment according to paragraph 1, wherein the number of modulation symbols in each segment changes from one segment to another and the I/Q interleaver circuitry is configured to adapt the interleaving in accordance with the number of modulation symbols in each segment.

Paragraph 3. An infrastructure equipment according to paragraph 2, wherein the number of modulation symbols in each segment varies in accordance with a variation in a number of sub-carriers which are available for carrying data on the OFDM symbols in which the segments are to be transmitted in the time-units of the wireless access interface.

Paragraph 4. An infrastructure equipment according to paragraphs 1, 2 or 3, wherein the I/Q interleaver circuitry includes an interleaver memory circuit in which one or both of the real components and the imaginary components are written into and read from to perform the interleaving, the size of the interleaver memory being determined in accordance with the integer number of OFDM symbols or part thereof of each segment.

Paragraph 5. An infrastructure equipment according to paragraph 4, wherein the integer number of OFDM symbols of each segment is varied dynamically, the maximum number of the OFDM symbols of each segment being determined in accordance with the size of the interleaver memory.

Paragraph 6. An infrastructure equipment according to paragraph 5, wherein the integer number of OFDM symbols of each segment is varied as a function of a speed of the communications device by reducing the number of sub-carriers in each OFDM symbol for a higher speed of the communications device, whilst increasing the integer number of OFDM symbols in the segment.

Paragraph 7. An infrastructure equipment according to paragraph 5, wherein the integer number of OFDM symbols of each segment is varied in accordance with a number of the OFDM symbols allocated for transmitting the data to the communications device in each time-unit.

Paragraph 8. An infrastructure equipment according to paragraph 5, wherein the transmitter circuitry is configured under the control of the controller circuitry to transmit a downlink control message indicating the integer number of OFDM symbols of each segment.

Paragraph 9. An infrastructure equipment according to paragraph 7 or 8, wherein the integer number of OFDM symbols for each segment is adapted as a function of a number of a physical resource blocks in each time-unit allocated for transmitting data to the communications device.

Paragraph 10. An infrastructure equipment according to paragraphs 1 to 9, wherein the transmitter circuitry is configured under the control of the controller circuitry to transmit the same segment of modulation symbols from the I/Q interleaver repeatedly in one or more different OFDM symbols whereby one of the repeated transmissions of the segment is interleaved in a different order to another one of the repeated transmissions.

Paragraph 11. An infrastructure equipment according to paragraphs 1 to 10, wherein the I/Q interleaver is configured to interleave the real component of the modulation symbols differently to the imaginary component, an amount by which adjacent signal samples representing one or both of the real or imaginary components being separated from one another after the I/Q interleaver being related to half of a number of the OFDM symbols allocated for transmitting each segment to the communications device.

Paragraph 12. An infrastructure equipment according to paragraph 11, wherein at least one of the real components of the rotated modulation symbols or the imaginary components of the rotated modulation symbols are interleaved in time by writing the real or imaginary components into a circular buffer and reading the real or imaginary components out of the circular buffer in a different order and the other of the real or imaginary components is not interleaved.

Paragraph 13. An infrastructure equipment according to paragraphs 1 to 12, wherein the modulator circuit includes transforming circuitry, the transforming circuitry comprising a constellation rotator configured to receive the modulation symbols and to rotate the phase of the modulation symbols in accordance with a predetermined rotation angle before interleaving.

Paragraph 14. An infrastructure equipment according to paragraphs 1 to 13, wherein the mapping circuitry is configured to map the sub-carriers of the OFDM symbols formed from the re-combined real and imaginary components on to resource elements which are separated in frequency by using different frequency domain sections of the wireless access interface.

Paragraph 15. A transmitter circuitry comprising frame builder circuitry configured to receive data to be transmitted to a communications devices from an infrastructure equipment of a wireless communications network, and to form the data into one or more data-blocks for transmission via a wireless access interface having a time divided structure comprising repeating time-units of resource elements, modulator circuitry configured to modulate a plurality of sub-carriers of one or more Orthogonal Frequency Division Multiplexed, OFDM, symbols with the data of each data-block in accordance with a modulation scheme, and mapping circuitry configured to map the sub-carriers of each of the one or more OFDM symbols onto the resource elements of one or more time-units of the wireless access interface in the frequency domain for transmission, and radio frequency transmission circuitry configured to transmit each of the one or more OFDM symbols in the one or more time-units, wherein the modulator circuitry includes modulation symbol generator circuitry configured to receive the data and to generate modulation symbols representing the data each modulation symbol for modulating a corresponding sub-carrier of the OFDM symbols in accordance with a modulation scheme, segmentation circuitry configured to receive the modulation symbols representing the data and to divide the modulation symbols into segments of modulation symbols for transmission, each segment of the modulation symbols for transmission via an integer number of the one or more OFDM symbols or part thereof, modulation rotation circuitry configured to receive the modulation symbols of one segment and to rotate each modulation symbol by an angle dependent on the choice of modulation scheme, I/Q interleaver circuitry, which is configured to receive each of the segments of rotated modulation symbols and for each segment to separate real and imaginary components of the rotated modulation symbols of the segment and to interleave the real components of the rotated modulation symbols of the segment differently to the imaginary components of the rotated modulation symbols of the segment, and I/Q combiner circuitry configured to re-combine the real and imaginary components of the modulation symbols of each segment and to form the modulation symbol for modulating each of the plurality of sub-carriers of each of the integer number of OFDM symbols or part thereof for the segment to be transmitted.

Paragraph 16. A communications device for transmitting to an infrastructure equipment of a wireless communications network, the communications device comprising transmitter circuitry configured to transmit signals to the infrastructure equipment via a wireless access interface formed by the infrastructure equipment, and controller circuitry configured to control the transmitter circuitry to transmit data represented as the signals via the wireless access interface having a time divided structure of repeating time units, each of the time units comprising a predetermined number of resource elements disposed in time and frequency, the transmitter circuitry comprising frame builder circuitry configured to receive the data to be transmitted to the infrastructure equipment, and to form the data into one or more data-blocks for transmission via one or more of the time-units of the wireless access interface, modulator circuitry configured to modulate a plurality of sub-carriers of one or more Orthogonal Frequency Division Multiplexed, OFDM, symbols with the data of each data-block in accordance with a modulation scheme, and mapping circuitry configured to map the sub-carriers of each of the one or more OFDM symbols onto the resource elements of the one or more time-units of the wireless access interface in the frequency domain for transmission, and radio frequency transmission circuitry configured to transmit each of the one or more OFDM symbols in the one or more time-units, wherein the modulator circuitry includes modulation symbol generator circuitry configured to receive the data and to generate modulation symbols representing the data each modulation symbol for modulating a corresponding sub-carrier of the OFDM symbols in accordance with a modulation scheme, segmentation circuitry configured to receive the modulation symbols representing the data and to divide the modulation symbols into segments of modulation symbols for transmission, each segment of the modulation symbols being arranged for transmission via an integer number of the one or more OFDM symbols or part thereof, modulation rotation circuitry configured to receive the modulation symbols of one segment and to rotate each modulation symbol by an angle dependent on the choice of modulation scheme, I/Q interleaver circuitry, which is configured to receive each of the segments of rotated modulation symbols and for each segment to separate real and imaginary components of the rotated modulation symbols of the segment and to interleave the real components of the rotated modulation symbols of the segment differently to the imaginary components of the rotated modulation symbols of the segment, and I/Q combiner circuitry configured to re-combine the real and imaginary components of the modulation symbols of each segment and to form the modulation symbol for modulating each of the plurality of sub-carriers of each of the integer number of OFDM symbols for the segment to be transmitted.

Paragraph 17. An infrastructure equipment of a wireless communications network for transmitting data to and receiving data from communications devices, the infrastructure equipment comprising transmitter circuitry configured to transmit signals to the communications devices via a wireless access interface, receiver circuitry configured to receive signals transmitted from communications devices via the wireless access interface, and controller circuitry configured to control the transmitter circuitry and the receiver circuitry to form the wireless access interface to transmit data represented as the signals to one or more of the communications devices and to receive data represented as the signals transmitted from the one or more communications devices, the wireless access interface having a time divided structure of repeating time units, each of the time units comprising a predetermined number of resource elements disposed in time and frequency, and the receiver circuitry comprises detector circuitry configured to detect a received signal comprising the data carried by one or more Orthogonal Frequency Division Multiplexed (OFDM) symbols and to produce log-likelihood ratios from the detected received signal, and demodulator circuitry for recovering the data from the one or more OFDM symbols, by demodulating modulation cells recovered from sub-carriers of the one or more OFDM symbols using the log-likelihood ratios, wherein the demodulator circuitry comprises segmentation circuitry configured to receive the log-likelihood ratios from an integer number of the one or more of the OFDM symbols or part thereof and to form the log-likelihood ratios into segments of log-likelihood ratios, I/Q de-interleaver circuitry configured to receive each of the segments of log-likelihood ratios and for each segment to separate real and imaginary components of the log-likelihood ratios for the segment and to de-interleave the real components of the log-likelihood ratios of the segment differently to the imaginary components of the segment, and a diversity combiner circuitry configured to combine the log-likelihood ratios output from the I component and Q component demodulation circuitry to demodulate the data of each segment.

Paragraph 18. A receiver circuitry comprising detector circuitry configured to detect a received signal comprising the data carried by one or more Orthogonal Frequency Division Multiplexed (OFDM) symbols, and demodulation circuitry configured to generate an estimate of the modulation cell carried by one or more OFDM symbols to output log-likelihood ratios being soft decisions of the I and Q components of the modulation cell, segmentation circuitry configured to receive the log-likelihood ratios from an integer number of the one or more of the OFDM symbols and to form the log-likelihood ratios into segments of log-likelihood ratios, I/Q de-interleaver circuitry configured to receive each of the segments of log-likelihood ratios and for each segment to de-interleave the log-likelihood ratios corresponding to the real components of the modulation cells of the segment differently to the log likelihood ratios corresponding to the imaginary components of the modulation cells of the segment, and a diversity combiner circuitry configured to combine the log-likelihood ratios output from the I component and Q component demodulation circuitry to demodulate the data of each segment.

Paragraph 19. A method of transmitting comprising receiving data to be transmitted to a communications device from an infrastructure equipment of a wireless communications network, and forming the data into one or more data-blocks for transmission via a wireless access interface having a time divided structure comprising repeating time-units of resource elements, modulating a plurality of sub-carriers of one or more Orthogonal Frequency Division Multiplexed, OFDM, symbols with the data of each data-block in accordance with a modulation scheme, and mapping the sub-carriers of each of the one or more OFDM symbols onto the resource elements of one or more time-units of the wireless access interface in the frequency domain for transmission, and transmitting each of the one or more OFDM symbols in the one or more time-units, wherein the modulating includes generating modulation symbols representing the data, each modulation symbol for modulating a corresponding sub-carrier of the OFDM symbols in accordance with a modulation scheme, dividing the modulation symbols into segments of modulation symbols for transmission, each segment of the modulation symbols for transmission via an integer number of the one or more OFDM symbols or part thereof, rotating each modulation symbol by an angle dependent on the choice of modulation scheme, for each segment separating real and imaginary components of the rotated modulation symbols of the segment and interleaving the real components of the rotated modulation symbols of the segment differently to the imaginary components of the rotated modulation symbols of the segment, and re-combining the real and imaginary components of the modulation symbols of each segment and forming the modulation cell for modulating each of the plurality of sub-carriers of each of the integer number of OFDM symbols or part thereof for the segment to be transmitted.

Paragraph 20. A method of receiving comprising detecting a received signal comprising the data carried by one or more Orthogonal Frequency Division Multiplexed (OFDM) symbols, and generating an estimate of the modulation cell carried by one or more OFDM symbols to output log-likelihood ratios being soft decisions of the I and Q components of the modulation cell, receiving the log-likelihood ratios from an integer number of the one or more of the OFDM symbols and forming the log-likelihood ratios into segments of log-likelihood ratios, receiving each of the segments of log-likelihood ratios at an I/Q de-interleaver circuitry and for each segment de-interleaving the log-likelihood ratios corresponding to the real components of the modulation cells of the segment differently to the log likelihood ratios corresponding to the imaginary components of the modulation cells of the segment, and combining the log-likelihood ratios output from the I component and Q component demodulation circuitry to demodulate the data of each segment.

Paragraph 21. A computer program providing computer executable instructions which when loaded onto a computer causes the computer to perform the method according to paragraph 19 or paragraph 20.

REFERENCES

[1] Holma H. and Toskala A [1] ISBN 9780470-319338 Fourth edition, 2007 Chapter 5
[2] EN 302 755 v1.3.1, 'Framing structure, channel coding and modulation for a second generation digital terrestrial television broadcasting system (DVB-T2)', ETSI, April 2012.
[3] J Boutrous, E Viterbo, 'Singnal Space Diversity: A Power- and Bandwidth-Efficient Diversity Technique for the Rayleight Fading Channel', pp 1453-1467, IEEE Trans. On Information Theory, Vol 44, No 4, July 1998.
[3] PCT/GB2015/053440

Annex 1:

As shown in FIG. 4, each LTE uplink sub-frame may include a plurality of different channels, for example a physical uplink communications channel (PUSCH) 305, a physical uplink control channel (PUCCH) 306, and a physical random access channel (PRACH). The physical Uplink Control Channel (PUCCH) may carry control information such as ACK/NACK to the eNodeB for downlink transmissions, scheduling request indicators (SRI) for UEs wishing to be scheduled uplink resources, and feedback of downlink channel state information (CSI) for example. The PUSCH may carry UE uplink data or some uplink control data. Resources of the PUSCH are granted via PDCCH, such a grant being typically triggered by communicating to the network the amount of data ready to be transmitted in a buffer at the UE. The PRACH may be scheduled in any of the resources of an uplink frame in accordance with a one of a plurality of PRACH patterns that may be signalled to UE in downlink signalling such as system information blocks. As well as physical uplink channels, uplink sub-frames may also include reference signals. For example, demodulation reference signals (DMRS) 307 and sounding reference signals (SRS) 308 may be present in an uplink sub-frame where the DMRS occupy the fourth symbol of a slot in which PUSCH is transmitted and are used for decoding of PUCCH and PUSCH data, and where SRS are used for uplink channel estimation at the eNodeB. The ePDCCH channel carries similar control information (DCI) as the PDCCH, but the physical aspects of PDCCH are different to those of ePDCCH, as discussed elsewhere herein. Further information on the structure and functioning of the physical channels of LTE systems can be found in [1].

In an analogous manner to the resources of the PDSCH, resources of the PUSCH are required to be scheduled or granted by the serving eNodeB and thus if data is to be transmitted by a UE, resources of the PUSCH are required to be granted to the UE by the eNodeB. At a UE, PUSCH resource allocation is achieved by the transmission of a scheduling request or a buffer status report to its serving eNodeB. The scheduling request may be made, when there is insufficient uplink resource for the UE to send a buffer status report, via the transmission of Uplink Control Information (UCI) on the PUCCH when there is no existing PUSCH allocation for the UE, or by transmission directly on the PUSCH when there is an existing PUSCH allocation for the UE. In response to a scheduling request, the eNodeB is configured to allocate a portion of the PUSCH resource to the requesting UE sufficient for transferring a buffer status report and then inform the UE of the buffer status report resource allocation via a DCI in the PDCCH. Once or if the UE has PUSCH resource adequate to send a buffer status report, the buffer status report is sent to the eNodeB and gives the eNodeB information regarding the amount of data in an uplink buffer or buffers at the UE. After receiving the buffer status report, the eNodeB can allocate a portion of the PUSCH resources to the sending UE in order to transmit some of its buffered uplink data and then inform the UE of the resource allocation via a DCI in the PDCCH. For example, presuming a UE has a connection with the eNodeB, the UE will first transmit a PUSCH resource request in the PUCCH in the form of a UCI. The UE will then monitor the PDCCH for an appropriate DCI, extract the details of the PUSCH resource allocation, and transmit uplink data, at first comprising a buffer status report, and/or later comprising a portion of the buffered data, in the allocated resources.

Although similar in structure to downlink sub-frames, uplink sub-frames have a different control structure to downlink sub-frames, in particular the upper 309 and lower 310 subcarriers/frequencies/resource blocks of an uplink sub-frame are reserved for control signaling rather than the initial symbols of a downlink sub-frame. Furthermore, although the resource allocation procedure for the downlink and uplink are relatively similar, the actual structure of the resources that may be allocated may vary due to the different characteristics of the OFDM and SC-FDM interfaces that are used in the downlink and uplink respectively. In OFDM each subcarrier is individually modulated and therefore it is not necessary that frequency/subcarrier allocation are contiguous however, in SC-FDM subcarriers are modulated in combination and therefore if efficient use of the available resources are to be made, contiguous frequency allocations for each UE may be preferable.

The invention claimed is:

1. A communications device for transmitting to an infrastructure equipment of a wireless communications network, the communications device comprising:
   circuitry configured to
   transmit signals to the infrastructure equipment via a wireless access interface formed by the infrastructure equipment,
   transmit data represented as signals via the wireless access interface having a time divided structure of repeating time units, each of one or more time units of the repeating time units comprising a predetermined number of resource elements disposed in time and frequency,
   receive the data to be transmitted to the infrastructure equipment, and form the data into one or more datablocks for transmission via the one or more time-units of the wireless access interface,
   modulate a plurality of sub-carriers of one or more Orthogonal Frequency Division Multiplexed, OFDM, symbols with the data of each data-block in accordance with a modulation scheme,
   map sub-carriers of each of the one or more OFDM symbols onto the resource elements of the one or more time-units of the wireless access interface in the frequency domain for transmission,
   transmit each of the one or more OFDM symbols in the one or more time-units,
   receive the data and generate modulation symbols representing the data, each modulation symbol for modulating a corresponding sub-carrier of the OFDM symbols in accordance with a modulation scheme,
   receive the modulation symbols representing the data and divide the modulation symbols into segments of modulation symbols for transmission, each segment of the modulation symbols being arranged for transmission via an integer number of the one or more OFDM symbols or part thereof,
   receive the modulation symbols of one segment and rotate each modulation symbol by an angle dependent on the choice of modulation scheme, and
   form the modulation symbol for modulating each of the plurality of sub-carriers of each of the integer number of OFDM symbols for the segment to be transmitted.

2. The communications device of claim 1, wherein the circuitry is further configured to
   receive each segment of rotated modulation symbols and separate, for each segment, real components of the rotated modulation symbols and imaginary components of the rotated modulation symbols of the segment.

3. The communications device of claim 2, wherein the circuitry is further configured to
   interleave the real components of the rotated modulation symbols of the segment differently to the imaginary components of the rotated modulation symbols of the segment.

4. The communications device of claim 3, wherein the circuitry is further configured to
   re-combine the real interleaved components of the rotated modulation symbols and imaginary components of the modulation symbols of each segment.

5. The communications device of claim 1, wherein a number of modulation symbols in each segment changes from one segment to another and the circuitry is further configured to adapt interleaving in accordance with the number of modulation symbols in each segment.

6. The communications device of claim 5, wherein the number of modulation symbols in each segment varies in accordance with a variation in a number of sub-carriers which are available for carrying data on the OFDM symbols in which the segments are to be transmitted in the time-units of the wireless access interface.

7. The communications device of claim 3, wherein the circuitry includes an interleaver memory circuit in which one or both of the real components and the imaginary components are written into and read from to perform interleaving, a size of the interleaver memory being determined in accordance with the integer number of one or more OFDM symbols or part thereof of each segment.

8. The communications device of claim 7, wherein the integer number of OFDM symbols of each segment is varied dynamically, a maximum number of the OFDM symbols of each segment being determined in accordance with the size of the interleaver memory.

9. The communications device of claim 8, wherein the integer number of OFDM symbols of each segment is varied as a function of a speed of the communications device by reducing the number of sub-carriers in each OFDM symbol for a higher speed of the communications device, whilst increasing the integer number of OFDM symbols in the segment.

10. The communications device of claim 8, wherein the integer number of OFDM symbols of each segment is varied in accordance with a number of the OFDM symbols allocated for transmitting the data to the communications device in each time-unit.

11. The communications device of claim 8, wherein the circuitry is further configured to receive a downlink control message indicating the integer number of OFDM symbols of each segment.

12. The communications device of claim 10, wherein the integer number of OFDM symbols for each segment is adapted as a function of a number of a physical resource blocks in each time-unit allocated for transmitting data to the communications device.

13. The communications device of claim 1, wherein the circuitry is further configured to transmit a same segment of modulation symbols from an I/Q interleaver repeatedly in one or more different OFDM symbols whereby one of a repeated transmissions of the same segment is interleaved in a different order to another one of the repeated transmissions.

14. The communications device of claim 13, wherein the I/Q interleaver is configured to interleave the real component of the modulation symbols differently to the imaginary component, an amount by which adjacent signal samples representing one or both of the real or imaginary components being separated from one another after the I/Q interleaver being related to half of a number of the OFDM symbols allocated for transmitting each segment to the communications device.

15. The communications device of claim 14, wherein at least one of the real components of the rotated modulation symbols or the imaginary components of the rotated modulation symbols are interleaved in time by writing the real or imaginary components into a circular buffer and reading the real or imaginary components out of the circular buffer in a different order and the other of the real or imaginary components is not interleaved.

16. The communications device of claim 4, wherein the circuitry is further configured to map the sub-carriers of each of the one or more OFDM symbols formed from the re-combined real and imaginary components on to resource elements which are separated in frequency by using different frequency domain sections of the wireless access interface.

17. A receiver circuitry, comprising:
detect a received signal comprising the data carried by one or more Orthogonal Frequency Division Multiplexed (OFDM) symbols, and
generate an estimate of a modulation cell carried by one or more OFDM symbols to output log-likelihood ratios being soft decisions of I and Q components of the modulation cell,
receive the log-likelihood ratios from an integer number of the one or more of the OFDM symbols and to form the log-likelihood ratios into segments of log-likelihood ratios,
receive each of the segments of log-likelihood ratios and, for each segment, de-interleave the log-likelihood ratios corresponding to real components of the modulation cells of each segment differently to the log likelihood ratios corresponding to imaginary components of the modulation cells of each segment, and
combine the log-likelihood ratios output from the I component and Q component demodulation circuitry to demodulate the data of each segment.

18. A method of transmitting, comprising:
receiving data to be transmitted to a communications device from an infrastructure equipment of a wireless communications network, and forming the data into one or more data-blocks for transmission via a wireless access interface having a time divided structure comprising repeating time-units of resource elements,
modulating a plurality of sub-carriers of one or more Orthogonal Frequency Division Multiplexed, OFDM, symbols with the data of each data-block in accordance with a modulation scheme,
mapping sub-carriers of each of the one or more OFDM symbols onto the resource elements of one or more time-units of the wireless access interface in the frequency domain for transmission,
transmitting each of the one or more OFDM symbols in the one or more time-units, wherein the modulating includes
generating modulation symbols representing the data, each modulation symbol for modulating a corresponding sub-carrier of the OFDM symbols in accordance with a modulation scheme,
dividing the modulation symbols into segments of modulation symbols for transmission, each segment of the modulation symbols for transmission via an integer number of the one or more OFDM symbols or part thereof,
rotating each modulation symbol by an angle dependent on the choice of modulation scheme, and
forming the modulation cell for modulating each of the plurality of sub-carriers of each of the integer number of OFDM symbols or part thereof for the segment to be transmitted.

19. The method of claim 18, further comprising:
separating, for each segment, real components of the rotated modulation symbols and imaginary components of the rotated modulation symbols of the segment, and interleaving the real components of the rotated modulation symbols of the segment differently to the imaginary components of the rotated modulation symbols of the segment.

20. The method of claim 19, further comprising:
re-combining the real and imaginary components of the modulation symbols of each segment.

\* \* \* \* \*